United States Patent
Om

(12) 
(10) Patent No.: US 7,277,983 B1
(45) Date of Patent: Oct. 2, 2007

(54) METHOD AND APPARATUS FOR SMOOTHING CURRENT TRANSIENTS IN A CONTENT ADDRESSABLE MEMORY (CAM) DEVICE

(75) Inventor: Hari Om, Santa Clara, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 322 days.

(21) Appl. No.: 11/085,399

(22) Filed: Mar. 21, 2005

Related U.S. Application Data

(63) Continuation-in-part of application No. 11/014,123, filed on Dec. 15, 2004, now Pat. No. 7,149,101.

(51) Int. Cl.
*G06F 12/00* (2006.01)
*G11C 15/00* (2006.01)

(52) U.S. Cl. ......................... 711/108; 365/49
(58) Field of Classification Search ................ 711/108, 711/100; 365/49, 185.03, 189.02, 233, 194
See application file for complete search history.

(56) References Cited

U.S. PATENT DOCUMENTS

| | | | |
|---|---|---|---|
| 5,452,243 A * | 9/1995 | Ansel et al. ................... | 365/49 |
| 6,081,440 A | 6/2000 | Washburn et al. | |
| 6,108,227 A | 8/2000 | Voelkel | |
| 6,240,000 B1 * | 5/2001 | Sywyk et al. .................. | 365/49 |
| 6,253,280 B1 | 6/2001 | Voelkel | |
| 6,266,262 B1 | 7/2001 | Washburn et al. | |
| 6,370,613 B1 | 4/2002 | Diede et al. | |
| 6,480,406 B1 | 11/2002 | Jin et al. | |
| 6,502,163 B1 | 12/2002 | Ramankutty | |
| 6,504,740 B1 | 1/2003 | Voelkel | |
| 6,505,270 B1 | 1/2003 | Voelkel et al. | |
| 6,515,884 B1 | 2/2003 | Sywyk et al. | |
| 6,538,911 B1 | 3/2003 | Allan et al. | |
| 6,542,391 B2 | 4/2003 | Pereira et al. | |
| 6,647,457 B1 | 11/2003 | Sywyk et al. | |
| 6,661,716 B1 | 12/2003 | Sywyk | |
| 6,697,275 B1 | 2/2004 | Sywyk et al. | |
| 6,721,202 B1 | 4/2004 | Roge et al. | |
| 6,751,755 B1 | 6/2004 | Sywyk et al. | |
| 6,760,242 B1 | 7/2004 | Park et al. | |

(Continued)

OTHER PUBLICATIONS

U.S. Appl. No. 10/271,660, James, David.

(Continued)

*Primary Examiner*—Kimberly McLean-Mayo
(74) *Attorney, Agent, or Firm*—Haverstock & Owens LLP

(57) ABSTRACT

A CAM device (100) according to an embodiment can include a control circuit (106) that can sequentially activate, with dummy operations, an increasingly larger number of CAM blocks (102-1 to 102-16) in response to a start-up circuit (104) indication until an initial number of CAM blocks is activated. A control circuit (106) can receive a user configurable block number (USER_BLK) and adjust the number of CAM blocks in a sequentially fashion, with dummy operations, until the user configurable number of CAM blocks is being activated. If a received command is targeted to less than the user configurable block number of CAM blocks, a control circuit (106) can activate, with dummy operations, an additional number of CAM blocks so that the total number of CAM blocks activate equals the user configurable block number.

20 Claims, 16 Drawing Sheets

U.S. PATENT DOCUMENTS

| | | |
|---|---|---|
| 6,763,425 B1 | 7/2004 | Pereira |
| 6,763,426 B1 | 7/2004 | James et al. |
| 6,772,279 B1 | 8/2004 | Sun et al. |
| 6,804,744 B1 | 10/2004 | Abbas |
| 6,845,024 B1 | 1/2005 | Wanzakhade et al. |
| 6,876,558 B1 | 4/2005 | James et al. |
| 6,892,273 B1 | 5/2005 | James et al. |

OTHER PUBLICATIONS

U.S. Appl. No. 10/320,049, James, David.
U.S. Appl. No. 10/286,198, James, David.
U.S. Appl. No. 10/286,199, Rajamanlckam, Jagad.
U.S. Appl. No. 10/281,814, James, David.
U.S. Appl. No. 10/264,667, James, David.
U.S. Appl. No. 10/248,668, Rajamanlckam, Jagad.
U.S. Appl. No. 10/329,146 James, David.
U.S. Appl. No. 10/268,953, Wanzakhade, Sanjay.
U.S. Appl. No. 10/320,588, Wanzakhade, Sanjay.
U.S. Appl. No. 10/320,053, Wanzakhade, Sanjay.
U.S. Appl. No. 10/202,526, Zou, Janet.
U.S. Appl. No. 10/873,608, Meng, Anita X.
U.S. Appl. No. 10/746,899, Om, Hari.
U.S. Appl. No. 11/000,568, Smith, Scott.
U.S. Appl. No. 11/011,464, Smith, Scott.
U.S. App. No. 10/897,062, Vankatachary, Sriniv.
U.S. Appl. No. 10/940,129, Narum, Steven.
U.S. Appl. No. 10/950,323, Birman, Mark.
U.S. Appl. No. 10/977,516, Om, Hari.
U.S. Appl. No. 11/014,123, Om, Hari.
U.S. Appl. No. 11/043,381, Gupta, Pankaj.
U.S. Appl. No. 60/612,905, Venkatachary, Sriniv.
U.S. Appl. No. 60/663,656, Maheshwarl, Dinesh.
U.S. Appl. No. 60/661,745, Maheshwari, Dinesh.
U.S. Appl. No. 60/657,754, Maheshwari, Dinesh.
U.S. Appl. 60/629,694, Jiang, Bin.
U.S. Appl. No. 60/666,875, Maheshwari, Dinesh.
U.S. Appl. No. 11/085,399, Om, Hari.
U.S. Appl. No. 11/089,837, Smith, Scott.
U.S. Appl. No. 60/867,325, Om, Hari.
U.S. Appl. No. 10/217,746, Chou, Richard.
U.S. Appl. No. 11/090,116, Banachowtcz, Bartosz.

* cited by examiner

INIT_BLK = 8

USER_BLK = 14

USER_BLK = 6

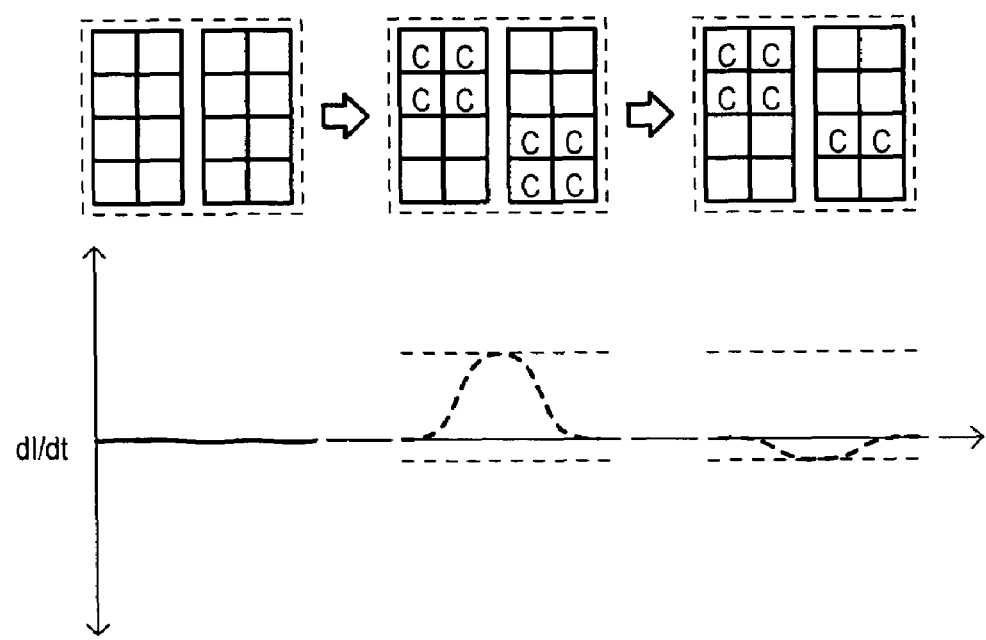
FIG. 4 (CONVENTIONAL)

METHOD AND APPARATUS FOR SMOOTHING CURRENT TRANSIENTS IN A CONTENT ADDRESSABLE MEMORY (CAM) DEVICE

This application is a continuation-in-part of U.S. patent application Ser. No. 11/014,123 filed Dec. 15, 2004, now U.S. Pat. No. 7,149,101, the contents of which are incorporated by reference herein.

TECHNICAL FIELD

The present invention relates generally to content addressable memory (CAM) devices, and more particularly to the activation of blocks within a CAM device.

BACKGROUND OF THE INVENTION

Content addressable memory (CAM) devices, sometimes also referred to as "associative memories", can provide rapid matching functions between an applied data value (e.g., a comparand, compare data, or search key) and stored data values (e.g., entries). Such rapid matching functions are often utilized in routers, network switches, and the like, to process network packets. As but two examples, a CAM can be utilized to search access control lists (ACLs) or forwarding information bases (FIBs). As is well know, an ACL can include a set of rules (data set) that can limit access (e.g., forwarding of packets) to only those packets having fields falling within a particular range. An FIB can include data necessary for forwarding a packet, typically the generation of a "next hop" address in response to a destination address.

A typical CAM device can store a number of data values in a CAM cell array. In a compare (i.e., match) operation, entries can be compared to a compare data value. An entry that matches the compare data value can result in the generation of a match indication.

In a conventional CAM device, search operations can be conducted in response to a system clock, with searches being undertaken every clock cycle. As a result, CAM devices can draw considerable current as match lines in the CAM cell array are continuously charged and discharged each clock cycle.

Current draw in a CAM device can be particularly problematic in the case of a "cold start" operation. A cold start operation can occur when a CAM device switches from an idle state, in which the various CAM array sections of the device are not operational, to an active state, in which CAM array sections perform various functions, such as a search operation, or the like.

Existing conventional approaches can transition from an idle state to a full active state (e.g., search) in a single cycle. This can potentially happen on every other cycle. When a CAM device portion (e.g., a core or block) goes from an idle to an active operation, there can be a very large change in the current requirement for the device. In current and future generation parts, such a current surge may be too large for the on-chip capacitance to support and can happen too quickly for capacitors on circuit boards associated with the CAM device to respond.

Still further, parasitic inductance of a package containing a CAM device, as well as inductance inherent in a CAM device mounting arrangement, can prevent a fast ramp up of the current, preventing an adequate current supply from being provided when needed by the CAM device.

The above deficiencies can result in a power supply voltage "sag" (i.e., level dip) within the CAM device. In addition, the rapid change in current (dI/dt) through parasitic inductive elements can give rise to ground "bounce" (transient jump in a low supply voltage level), which can further disturb CAM device operations. These undesirable variations in supply voltages can lead to failures. Such failures are often referred to as "cold start" failures or problems.

To better understand various features and advantages of the disclosed embodiments of the present invention, examples of other CAM device cold start operations will now be described with reference to FIGS. 17A and 17B.

FIG. 17A is a block diagram of one approach for reducing overall transient current in a CAM device. In the arrangement of FIG. 17A, a CAM device 1700 can be divided into two halves 1702-0 and 1702-1, with each half performing a search on opposite edges of a clock signal, and providing results to a synchronizer/priority encoder 1704. In particular, on one type of clock transition (e.g., low-to-high), one side 1702-1 (Panel B) can precharge match lines, while the other side 1702-0 (Panel A) evaluates (i.e., compares a search key to data in CAM entries). On the other clock transition (e.g., high-to-low), the two sides operate in the opposite fashion.

As shown in FIG. 17B, such an arrangement can help to spread out current demand within a cycle. FIG. 17B is a timing diagram showing an average current (I) drawn over time. By providing "intra-clock" activation, power supply transients within one clock cycle can be smoothened.

However, as CAM devices increase in capacity and operating speed, such an approach may not be sufficient to eliminate cold start and related problems. In particular, for higher capacity devices, in the above arrangement, current surges on each clock edge can cause a low power supply level to rise and a high power supply level to sag.

Thus, while the above approach may provide some relief on peak current draw within a single cycle for relatively slower and/or smaller CAM devices, such an arrangement may not address larger CAM devices, or inter cycle current demands or multi-cycle current power supply transients.

Examples of approaches to clocking different portions of CAM device are disclosed in U.S. Pat. No. 6,240,000, titled CONTENT ADDRESSABLE MEMORY WITH REDUCED TRANSIENT CURRENT, issued to Sywyk et al. on May 29, 2001. Another arrangement is disclosed in U.S. patent application Ser. No. 10/746,899, titled STAGGERED COMPARE ARCHITECTURE FOR CONTENT ADDRESSABLE MEMORY by Om et al., filed on Dec. 24, 2003, now U.S. Pat. No. 6,958,925. The contents of this application are incorporated by reference herein.

Various approaches for reducing a turn-on current (e.g., cold start current) in a CAM device by sequentially activating sections, and sequentially activating blocks within each section is shown in U.S. patent application Ser. No. 10/940,129, titled REDUCED TURN-ON CURRENT CONTENT ADDRESSABLE MEMORY (CAM) DEVICE AND METHOD by Narum et al., filed on Sep. 14, 2004, now U.S. Pat. No. 7,099,170. This application also describes in greater detail examples of cold start errors. This application is incorporated by reference herein.

In light of the above, it would be desirable to arrive at some way of reducing the rate at which current is drawn (dI/dt) by a CAM device when transitioning from a low (or no) activity state (e.g., start up) to a high activity state. In addition, it would also be desirable to arrive at some way of maintaining a low dI/dt after a device has started up and continues to operate.

It would be desirable if such arrangements did not decrease overall throughput of the CAM device.

SUMMARY OF THE INVENTION

The present invention can include a method of activating separate blocks of a content addressable memory (CAM) device. The method can include sequentially activating an increasingly larger number of CAM blocks until an initial number of CAM blocks is activated. If the initial number of CAM blocks is not equal to a configurable block number, the method can sequentially change the number of activated CAM blocks until the number of active CAM blocks is equal to the configurable block number value.

In this way, current rate changes can be reduced as a CAM device reaches some initial number of active CAM blocks, and then transitions to a configurable number of active CAM blocks.

According to one aspect of the embodiments, CAM block operations can be based on a CAM timing signal. In addition, prior to sequentially activating an increasingly larger number of CAM blocks, a method can determine that the CAM timing signal is stable. Such an arrangement can allow dummy activation operations to take place while other portions of the CAM device are still undergoing power-up sequences.

According to another aspect of the embodiments, determining that a CAM timing signal is stable can include determining that a phase locked loop (PLL) circuit is locked with a received clock signal. In another arrangement, such a step can include determining that a CAM clock signal has executed a predetermined number of cycles.

According to another aspect of the embodiments, sequentially activating an increasingly larger number of CAM blocks can include activating one CAM block each cycle of a clock signal until the initial number of CAM blocks is activated.

According to another aspect of the embodiments, a method can further include receiving a command targeted to activate a command number of CAM blocks. If the command number of CAM blocks is less than the configurable block number, an additional number CAM blocks, not targeted by the command, can be activated until the total number of CAM blocks activated is equal to the configurable block number.

In this way, dummy operations can be used to ensure that a same number of CAM blocks is activated in response to commands, and thus can avoid large current changes that can arise from the activation of different numbers of CAM blocks in successive operations.

The present invention can also include content addressable memory (CAM) device. A CAM device can include a plurality of CAM blocks, each comprising a plurality of CAM entries that compare a key value essentially simultaneously to data values stored in the CAM entries. The CAM device can also include a control circuit that receives a first control signal and a configurable block number value. A control circuit can sequentially activate an increasingly larger number of CAM blocks in response to a first control signal until an initial number of CAM blocks is activated. Further, if an initial number of CAM blocks is not equal to the configurable block number, the control circuit can sequentially change the number of activated CAM blocks until the number of CAM blocks is equal to the configurable block number value.

In such an arrangement, a CAM device can reach an initial number of active blocks, with relatively small current rate changes, without necessarily introducing any additional latency.

According to one aspect of the embodiments, a CAM device can further include a register coupled to the control circuit that stores the configurable block number. In such an arrangement, a user of the CAM device can write a configurable block number to such a register, to thereby establish the number of CAM blocks that can be activated.

According to another aspect of the embodiments, a CAM device can further include a timing circuit that activates the first control signal in response to a received clock signal. In one arrangement, such a timing circuit can include a phase locked loop (PLL) circuit that activates the first control signal when the PLL circuit is locked with the received clock signal. In another arrangement, such a timing circuit can include a clock divider/counter. More particularly, the timing circuit can include a divider circuit coupled to a received clock signal, a counter having an input coupled to the output of the divider circuit and an output that provides a count value, and a comparator that compares the count value to a predetermined value. The comparator can activate the first control signal based on a comparison result.

According to another aspect of the embodiments, a control circuit can sequentially activate one CAM block each cycle of CAM clock signal until the initial number of CAM blocks is activated.

According to another aspect of the embodiments, a control circuit can sequentially change a number of activated CAM blocks by one each cycle of a CAM clock signal until the number of CAM blocks is equal to the configurable block number value.

According to another aspect of the embodiments, if a configurable number value is less than the initial number of CAM blocks, the control circuit can sequentially decrease the number of active CAM blocks until the number of CAM blocks is equal to the configurable block number value.

According to another aspect of the embodiments, if a configurable block number value is greater than the initial number of CAM blocks, the control circuit can sequentially increase the number of active CAM blocks until the number of CAM blocks is equal to the configurable block number value.

According to another aspect of the embodiments, the CAM device can further include a command decoder that decodes a received command targeted to activate a command number of CAM blocks. If the command number of CAM blocks is less than the configurable block number value, the control circuit can activate an additional number CAM blocks not targeted by the decoded command until the total number of activated CAM blocks is equal to the configurable block number value.

The present invention can also include a method of reducing current consumption rate changes in a content addressable memory (CAM). The method can include issuing dummy search operations to increasingly larger numbers of CAM blocks within the CAM device until an initial number of CAM blocks is activated. An initial number of CAM blocks can be less than the total number of CAM blocks in the CAM device. The method may further include receiving a configurable block number, and incrementally changing the number of issued dummy searches if the configurable block number is different from the initial number of CAM blocks until the number of activated CAM blocks is equal to the configurable block number.

According to one aspect of the embodiments, issuing dummy search operations to increasingly larger numbers of CAM blocks can include increasing the number of dummy searches to the CAM blocks by one in successive time periods. In addition, incrementally changing the number of issued dummy searches can include, if the initial number of CAM blocks is greater than the configurable block number, decreasing the number of dummy searches by one in successive time periods until the number of activated CAM blocks is equal to the configurable block number. If the initial number of CAM blocks is less than the configurable CAM block number, the method can increase the number of dummy searches by one in successive time periods until the number of activated CAM blocks is equal to the configurable block number.

According to another aspect of the embodiments, a method can also include receiving a command targeted to activate a command number of CAM blocks, and issuing dummy searches to CAM blocks not targeted by the command if the number of CAM blocks targeted by the command is less than the configurable block number to bring the total number of CAM blocks activated in response to the command to the configurable block number.

According to another aspect of the embodiments, a command can include a read operation that accesses data stored in at least one CAM block.

BRIEF DESCRIPTION OF THE DRAWINGS

FIG. 4 shows plan views and corresponding timing diagram showing a conventional CAM device operation.

DETAILED DESCRIPTION

Various embodiments of the present invention will now be described in detail with reference to a number of drawings. The embodiments include a content addressable memory (CAM) device and operating method that can alleviate current transients occurring over multiple operational cycles by activating different portions (e.g., CAM blocks) of the CAM device according to dummy operations (e.g., a dummy search). As will be understood in more detail by the various described embodiments, a "dummy" operation can cause the activation of a CAM block, but does not yield any valid operation data. In contrast, an "actual" operation yield valid data from an accessed CAM block (e.g., search data, read data, etc.).

Figure 1:
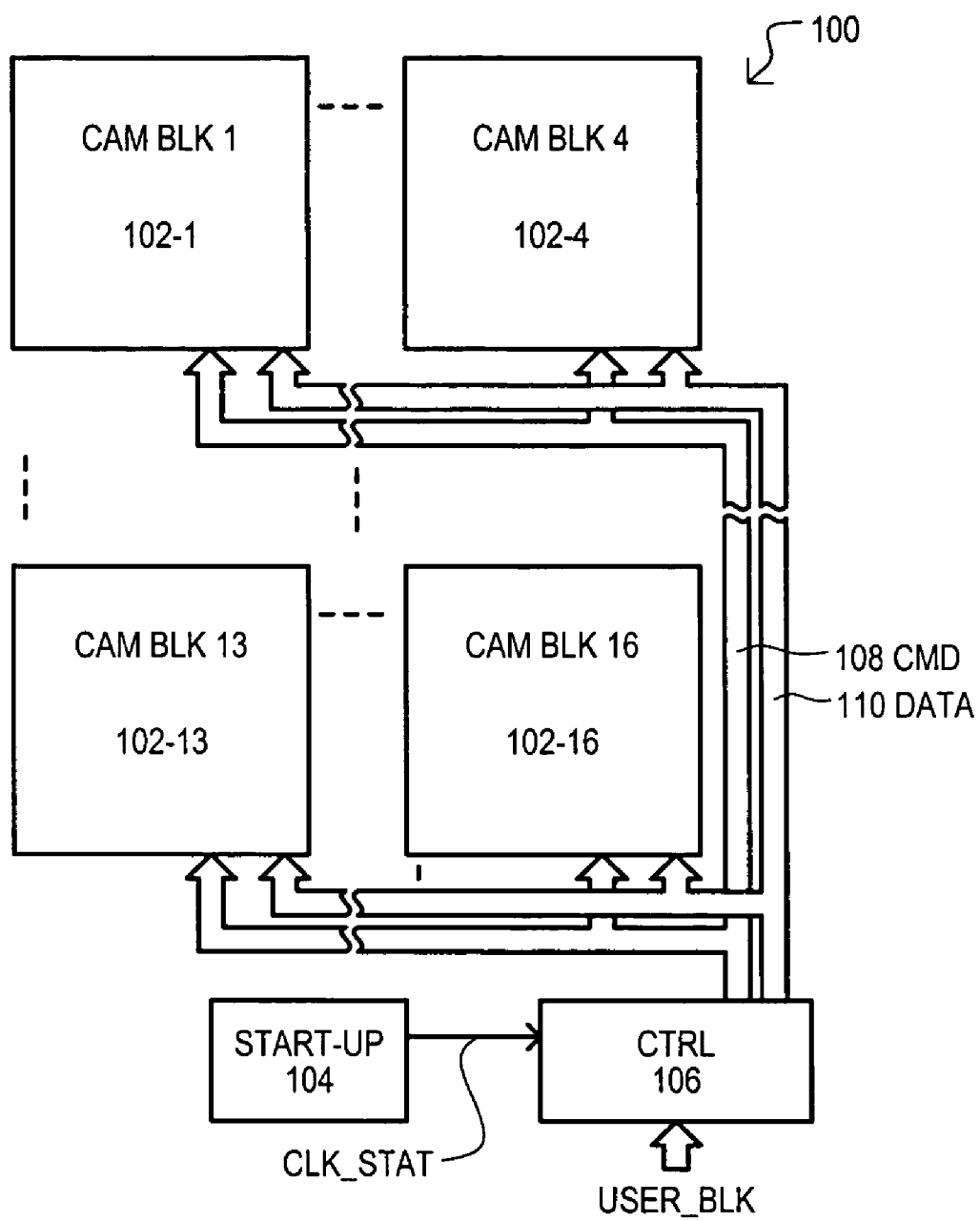
FIG. 1 is a block schematic diagram of a CAM device according to a first embodiment of the present invention.

A CAM device according to a first embodiment is shown in FIG. 1, and designated by the general reference character 100. A CAM device 100 can include a number of CAM blocks 102-1 to 102-16, a start-up circuit 104, and a control circuit 106. Each CAM block (102-1 to 102-16) can include multiple CAM entries, each of which can compare a search key value to a stored data value.

A start-up circuit 104 can detect predetermined device states in response to power being applied to a CAM device 100. According to such states, a start-up circuit 106 can activate an indication received by control circuit 106. In the very particular example of FIG. 1, a start-up circuit 104 can determine that internal timing within the CAM is stable, and activate a signal CLK_STAT.

A control circuit 106 can receive the indication from a start-up circuit 104 about the internal start-up time. Also, control circuit 106 can receive a user block number USER_BLK from a user after an external start-up time. The external start-up time can always be greater than an internal start-up time. A user block number USER_BLK can be a configurable value. More particularly, a user block number USER_BLK can be provided by the user of the CAM device 100 to establish a maximum number of blocks that will be in use in the device. In this way, if less than all the CAM blocks (102-1 to 102-16) are to be accessed, the number of CAM blocks activated in a given cycle can be maintained at the USER_BLK value, thereby reducing the overall power consumed by the CAM device. This is in contrast to a conventional device that would activate all CAM blocks.

In the particular example of FIG. 1, a control circuit 106 can be connected to CAM blocks (102-1 to 102-16) by way of a command bus 108 and a data bus 110. A command bus 108 can carry one or more signals for activating each CAM block. Such signals can be command signals corresponding to particular types of CAM operations, including but not limited to search operations, read operations, write operations, and "learn" operations. Further, according to the first embodiment, a command bus 108 can carry "dummy" operation signals that can activate a given CAM block in the same general fashion as an actual operation, but not yield a valid result. As such, a CAM block activated in a dummy operation can draw a similar, if not essentially the same amount of current as a CAM block executing an actual operation of the same type.

Having described the general structure of a CAM device 100 according to a first embodiment, a method according to a second embodiment will now be described with reference to FIGS. 2 and 3A to 3D.

Figure 2:
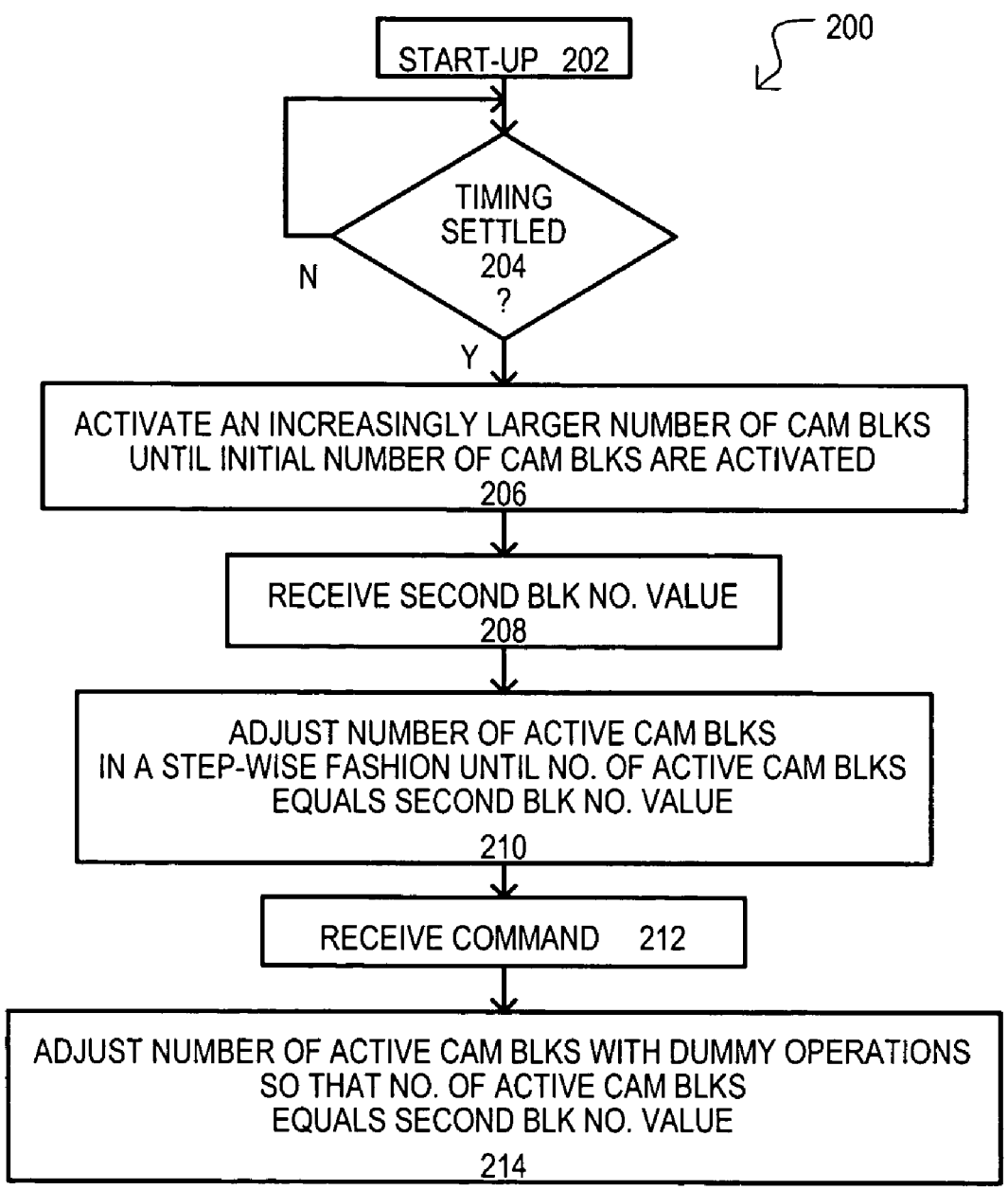
FIG. 2 is a flow diagram showing a method according to a second embodiment of the present invention.

FIG. 2 is a flow diagram showing a method 200 according to a second embodiment. However, the embodiment of FIG. 2 can be considered related to that of FIG. 1 in that the CAM device 100 can operate according to the method of FIG. 2.

A method 200 can include a start-up (step 202), which can include power being applied to a CAM device, or a CAM device being reset, or otherwise reconfigured. Thus, in the embodiment of FIG. 1, this can include power being applied to CAM device 100.

A method can further include determining whether timing has reached a settled state (step 204) or the internal clocks are stable in order to perform at least dummy operations. Such a step can include ensuring a device has sufficient functionality to execute at least dummy operations. If timing is not settled (N branch from 204), a method can wait until such a state is reached. In the embodiment of FIG. 1, this can include a start-up circuit 104 determining that timing has settled and activating a CLK_STAT indication.

If timing is settled (Y branch from 204), a method can proceed to sequentially activate an increasingly larger number of CAM blocks until an initial number of CAM blocks is activated (step 206). Such a step can include executing dummy operations in sequentially larger numbers of CAM blocks. Even more particularly, such a step can include sequentially increasing the number of CAM blocks activated by one, until half of the total number of CAM blocks is activated. In the embodiment of FIG. 1, a step 206 can include a control circuit 106 issuing dummy commands to increasingly larger numbers of the CAM blocks (102-1 to 102-16). As but one example, a control circuit can issue dummy search commands with dummy key values.

Once an initial number of blocks is activated, a method 200 can include receiving a second block number value (step 208). A second block number value can be a configurable value that establishes a limit to the maximum number of CAM blocks allowed to be activated at a time. In one very particular case, such a value can be user programmable value that establishes a maximum number of blocks that will take part in any compare operation. In the embodiment of FIG. 1, a step 208 can include a control circuit 106 receiving and/or reading a USER_BLK value.

A method 200 can then adjust the number of active CAM blocks in a step-wise fashion until the number of active CAM blocks is equal to the second block number value (step 210). Such a step can include determining if the initial number of CAM blocks is different than the second block number value. If a difference exists, dummy operations can be increased/decreased in the CAM blocks until the number of active CAM blocks equals the second block number value.

Even more particularly, a step 210 can include sequentially increasing/decreasing the number of CAM blocks activated by one, until the second block number value is reached. In the embodiment of FIG. 1, a step 210 can include a control circuit 106 increasing or decreasing the number of dummy commands issued to the CAM blocks (102-1 to 102-16), as needed, to eventually activate the number of CAM blocks indicated by the USER_BLK value.

In this way, CAM blocks can be activated in a sequential fashion in a start-up operation to thereby reduce the size of a current rate change.

Referring still to FIG. 2, a method 200 can also include command related steps. A method can include receiving a command (step 212). Such a step can include receiving a command from a CAM user that specifies a particular number of CAM blocks that will be activated. In response to such a command, a method 200 can adjust the number CAM blocks activated in response to the command so that the number of active CAM blocks is equal to the second block number value (step 214). Such a step can include issuing dummy commands to non-targeted CAM blocks in addition to actual command targeted to particular CAM blocks.

In this way, once a second (configurable) number of CAM blocks is being activated, this same number of CAM blocks can continue to be activated even if a received command is targeted to a smaller number of CAM blocks.

FIGS. 3A to 3D are plan view diagrams showing a CAM operation according to a third embodiment. Each of FIGS. 3A to 3D shows a CAM device having 16 CAM blocks, each represented by a square, with the dummy activation of a CAM block being indicated by hatching. Each of the figures also shows a representation of a resulting current consumption rate (dI/dt) as compared to a conventional approach. The embodiment of FIGS. 3A to 3D can be considered related to that of FIGS. 1 and 2 in that operations shown can correspond to portions of the method set forth in FIG. 2.

Figure 3A:
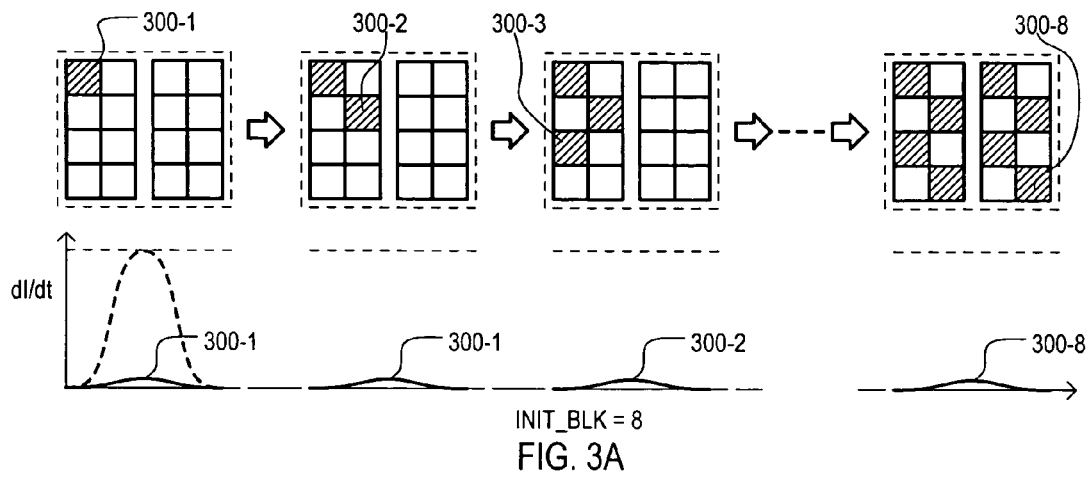
FIGS. 3A to 3D are plan views and corresponding timing diagrams showing the operation of CAM device according to a third embodiment.

Referring to FIG. 3A, a start up activation sequence is shown going from left to right. FIG. 3A shows a sequential activation of one CAM block up to an initial number of 8 CAM blocks (e.g., INITIAL_BLK=8). Thus, upon start-up, a CAM block 300-1 can be activated. This can be followed by CAM block 300-2, in a sequential fashion until CAM block 300-8 is activated, for a total of eight CAM blocks. In one arrangement, the sequence illustrated in FIG. 3A can be considered related to FIG. 2 in that it can correspond to steps 202 to 206 of FIG. 2.

Referring still to FIG. 3A, as shown by the dI/dt curve, the activation of each individual CAM block can result in an increase in the rate at which current is drawn. However, such rate can be small (e.g., $\frac{1}{16}^{th}$) as compared to a conventional arrangement, shown by a dashed line, that would activate 16 CAM blocks essentially simultaneously.

Figure 3B:
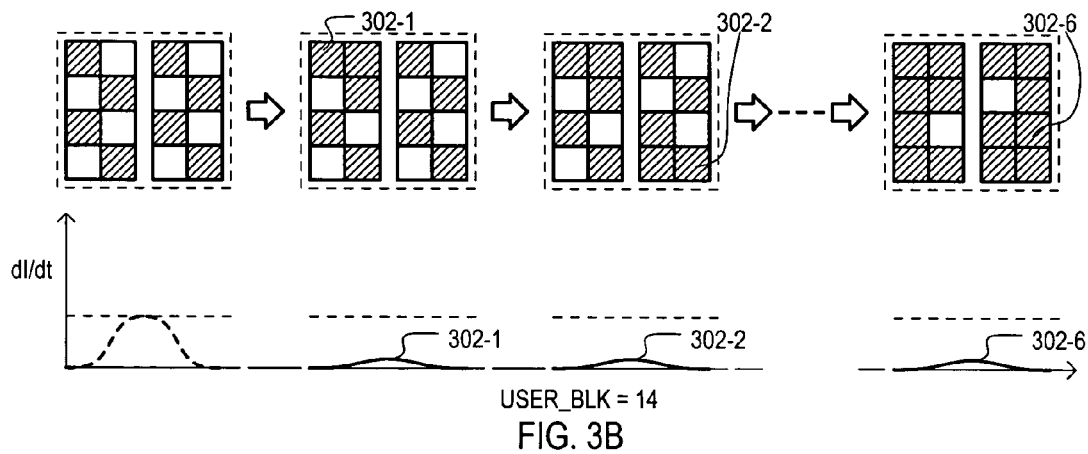

Referring to FIG. 3B, one example of an adjustment sequence is shown going from left to right. FIG. 3B shows a sequential activation of one CAM block to transition from eight initially activated CAM blocks, to a new configurable CAM block value of 14 (i.e., USER_BLK=14). Thus, a CAM block 302-1 can be activated, followed by a CAM block 302-2. Inactive CAM blocks can be activated by dummy operations in this fashion until 14 CAM blocks are activated. As shown by the corresponding dI/dt curve, the activation of each individual CAM block result in the same relatively small rate increases as shown in FIG. 3A. This rate can be small as compared to an abrupt activation of CAM blocks that could occur in a conventional approach, shown by a dashed line, in which an additional 6 CAM blocks are activated essentially simultaneously.

Figure 3C:
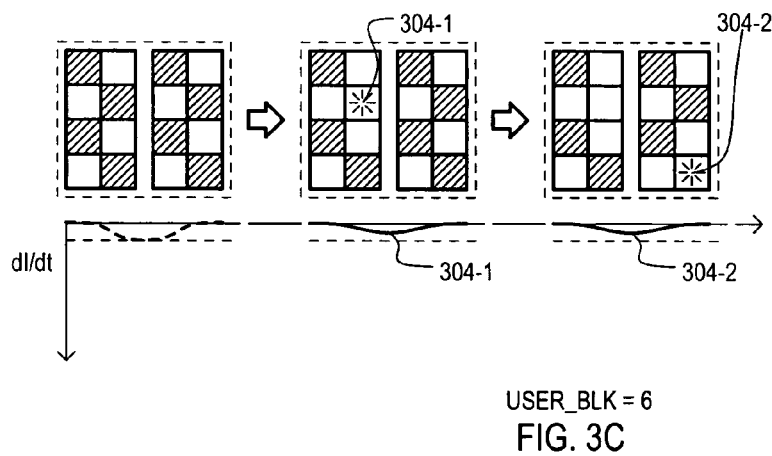

Referring to FIG. 3C, a second example of an adjustment sequence is shown going from left to right. In this case, the number of activated CAM blocks is decreased from an initial value of 8 to configurable value of 6 (e.g., USER_BLK=6). Thus, a CAM block 304-1 can be deactivated, followed by a CAM block 304-2 being deactivated. As shown by the corresponding dI/dt curve, the de-activation of each individual CAM block can result in a sequence of relatively small rate decreases, as opposed a higher current rate change that would result when multiple CAM blocks are deactivated simultaneously.

In one arrangement, the sequence illustrated in FIGS. 3B and 3C can be considered related to FIG. 2 in that such sequences can correspond to step 210 of FIG. 2.

Figure 3D:
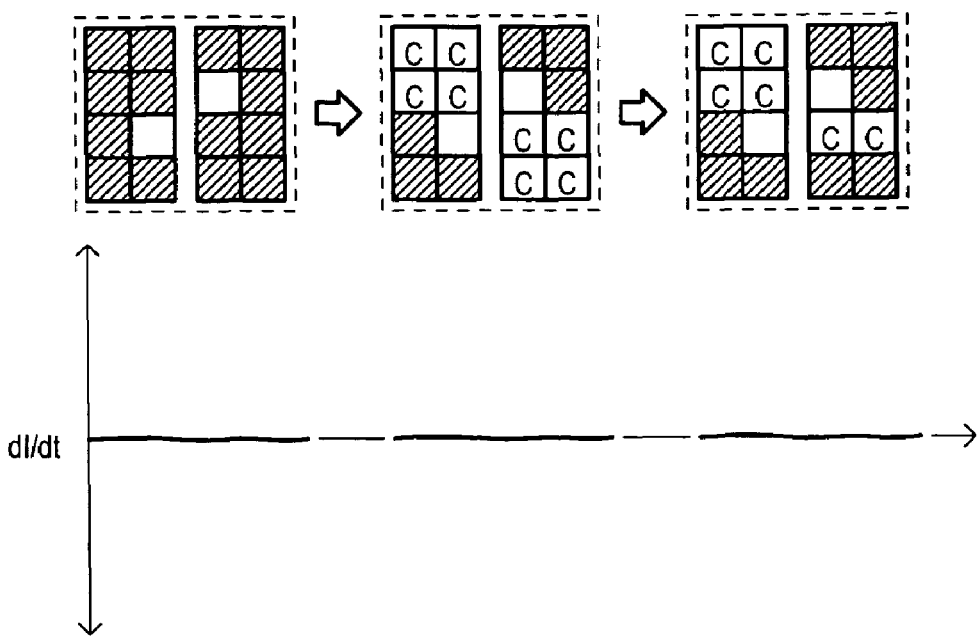

Referring now to FIG. 3D, a command adjustment sequence is shown going from left to right. The sequence shows a CAM device with 14 CAM blocks being activated by dummy operations that receives a first command targeted at eight CAM blocks followed by a second command targeted at six CAM blocks. CAM blocks activated in response to a command are shown with the symbol "C". In response to each command, a number of additional CAM blocks are activated with dummy operations in order to ensure that the number of CAM blocks is maintained at 14, regardless of the number of CAM blocks that are targeted by a command. As shown by the corresponding dI/dt curve, by maintaining the same number of activated CAM blocks, current rate changes can be kept at a minimum.

The arrangement of FIG. 3D is in contrast to a conventional approach shown in FIG. 4, that would activate different numbers of CAM blocks in response to each different command, thus generating considerable dI/dt changes.

In one arrangement, the sequence illustrated in FIG. 3D can be considered related to FIG. 2 in that such a sequence can correspond to steps 212 and 214 of FIG. 2.

Figure 5:
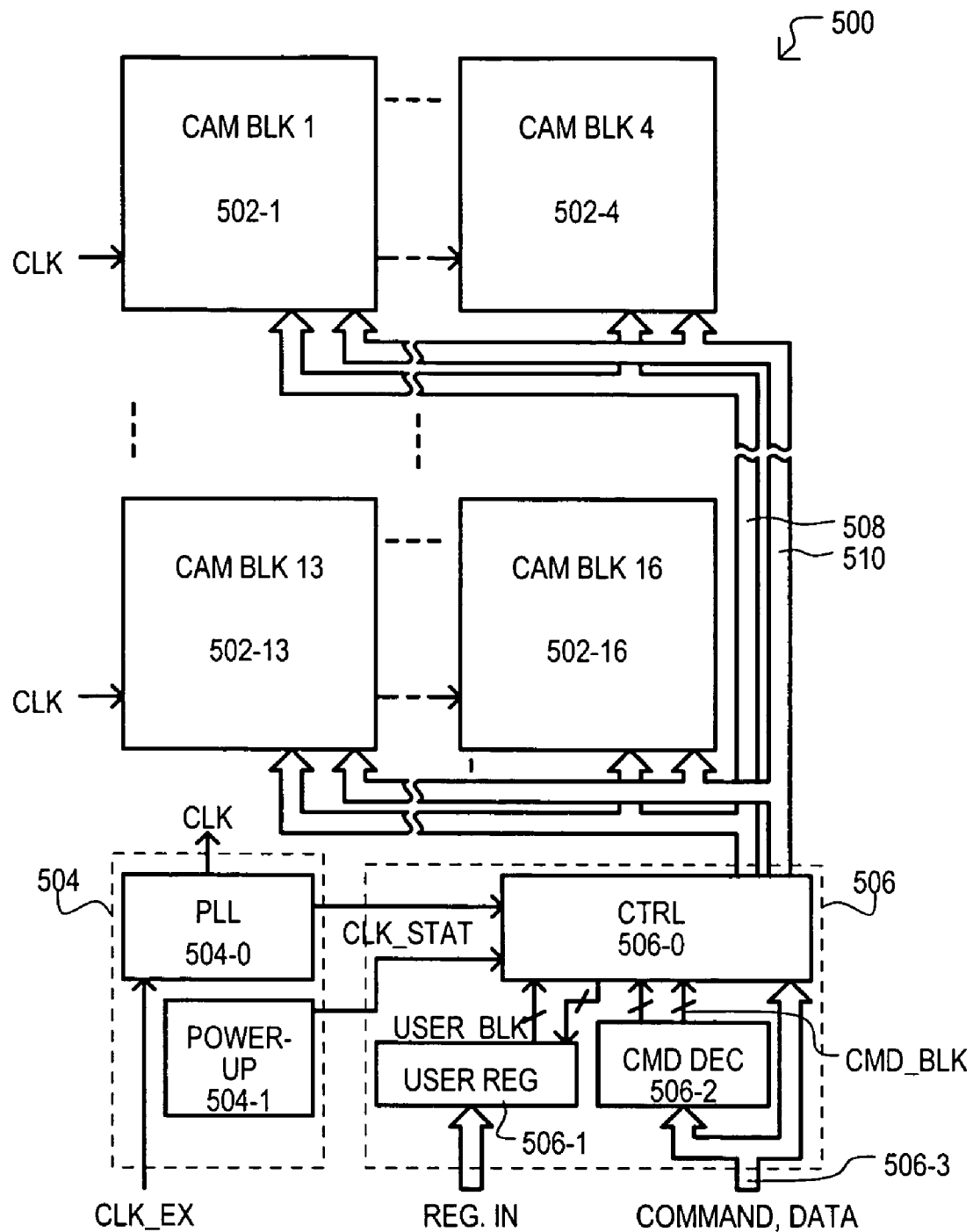
FIG. 5 is a block schematic diagram of a CAM device according to a fourth embodiment of the present invention.

A CAM device according to a fourth embodiment is shown in FIG. 5, and designated by the general reference character 500. A CAM device 500 can include some of the same general sections as FIG. 1, thus like sections are referred to by the same reference character but with the first digit being a "5" instead of a "1". Further, a CAM device according to a fourth embodiment can be considered related to that of the first embodiment in that it can represent a more detailed example of a first embodiment.

In the arrangement of FIG. 5, CAM blocks (502-1 to 502-16) can receive an internal clock signal CLK, and base the timing of operations on such a signal.

A start-up circuit 504 can include a phase locked loop (PLL) circuit 504-0 and a power-up circuit 504-1. A PLL circuit 504-0 can receive an external clock signal CLK_EX and generate an internal clock signal CLK that tracks (i.e., that is locked with) external clock signal CLK_EX. When a signal CLK is determined to be locked with external clock signal CLK_EX, a PLL circuit 5040 can activate a status signal CLK_STAT provided to control circuit 506.

A power-up circuit 504-1 can determine when a CAM device 500 is fully operational after the application of power. It is noted that a PLL circuit 504-0 may activate status signal 506 prior to power-up circuit 504-1 indicating the CAM device 500 is fully operational.

A control circuit 506 can include control logic 506-0, at least one user register 506-1, and a command decoder 506-2. Control logic 506-0 can issue commands, including dummy commands, on a command bus 508 in response to command data received on external bus 506-3 and decoded by command decoder 506-2 and/or a status value CLK_STAT. In addition, control logic 506-0 can receive and parse data received on bus 506-3, and output such data (e.g., search key values) on data bus 510.

A user register 506-1 can be one of a plurality of addressable registers for receiving and storing configurable values. A user register 506-1 can store a user block number value USER_BLK that can represent the maximum number of blocks enabled during a compare operation by a user. A command decoder 506-2 can decode received command data. In the very particular example of FIG. 5, a command decoder 506-2 can generate a command block value CMD_BLK, that can represent the number of CAM blocks (502-1 to 502-16) targeted by a given command.

Figure 6:
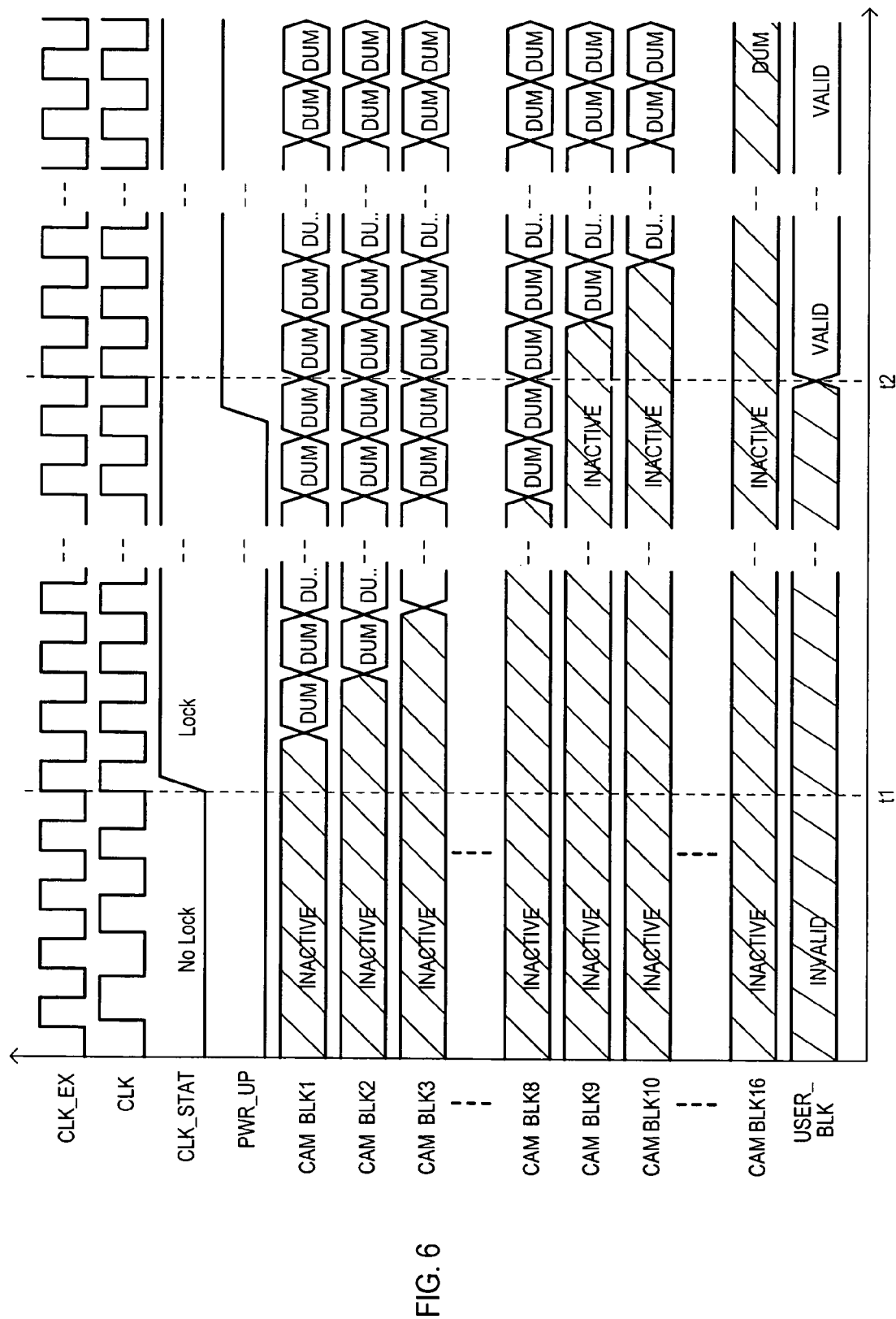
FIG. 6 is a timing diagram showing a power-up operation of the CAM device shown in FIG. 5.

The operation of the fourth embodiment will now be described with reference to FIG. 5 in conjunction with FIGS. 6 and 7. FIG. 6 is a timing diagram showing the sequential activation of CAM blocks with dummy operations in response to a power-up event. FIG. 6 includes a waveform of an external clock CLK_EX, an internal clock output by a PLL circuit CLK, a status indication CLK_STAT, a power-up indication PWR_UP, the status of various CAM blocks CAM BLK1 to CAM BLK16, and a user block status USER_BLK.

Prior to time t1, power and an external clock CLK_EX can be applied to a CAM device 500. A PLL circuit 5040 can begin trying to lock onto external clock signal CLK_EX. Because it may take some clock cycles for lock to take place, a status indication CLK_STAT can indicate that the PLL circuit 504-0 is not yet locked (remain low in this example). All CAM blocks (502-1 to 502-16) can be inactive at this time.

At time t1, a PLL circuit 504-0 can achieve a locked state with external clock signal CLK_EX and can activate status indication CLK_STAT (drive the signal high in this example). It is understood that while FIG. 6 shows the clock signal CLK in phase with external clock signal, such a signal could be phase shifted with respect to (but still synchronous with) an external clock signal CLK_EX. In addition or alternatively, an internal clock could be a multiplied and/or divided version of an external clock.

Following time t1, in response to an active status indication CLK_STAT, control logic 506-0 can begin sequentially activating increasingly larger numbers of CAM blocks, with dummy operations, until an initial number of CAM blocks are being activated every cycle. In the very particular example of FIG. 6, control logic 506-0 activates an additional CAM block each cycle, until an initial eight CAM blocks are activated. Dummy activation of a CAM block is represented by the symbol "DUM".

At time t2, a power-up circuit 504-1 can activate a power up indication PWR_UP to indicate that a CAM device has successfully completed a power-up sequence. At this time, a user block number value can be valid. Thus, if such a value has already been stored, the value can be read from a user register 506-1 to control logic. Alternatively, an indication can be generated to notify users that a user register 506-1 can now store a user block number value.

In response to a valid user register value, control logic 506-0 can sequentially activate or deactivate CAM blocks with dummy operations until the number of active CAM blocks is equal to the user block value. In the very particular example of FIG. 5, the user block number is ten, thus control logic 506-0 activates CAM blocks 1-9 (by enabling CAM block 9) in one cycle, and then CAM blocks 1-10 in the next cycle.

In this way, upon power-up, a CAM device can activate a sequential numbers of CAM blocks to meet some initial number, and then, if necessary, sequentially adjust such a number to meet a user configurable (visible) number of active CAM blocks.

Figure 7:
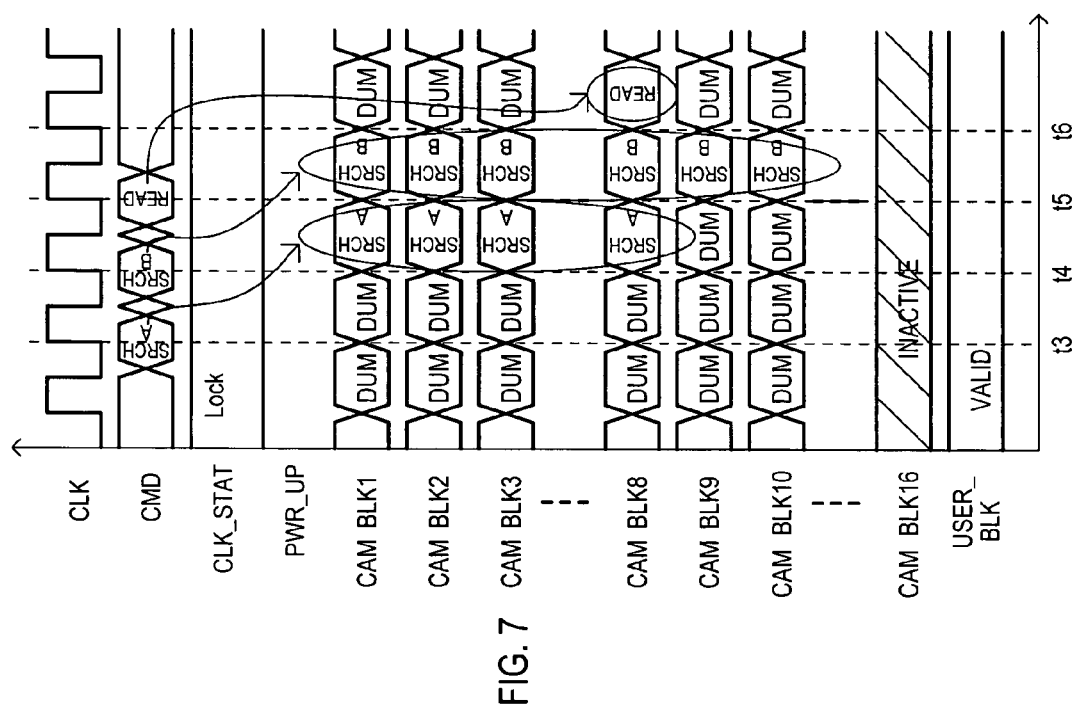
FIG. 7 is a timing diagram showing a command execution operation of the CAM device shown in FIG. 5.

FIG. 7 is a timing diagram showing the activation of CAM blocks in response to various command that target a specific number of CAM blocks. FIG. 7 includes most of the waveforms shown in FIG. 6, but also adds a command waveform CMD, which shows a received command.

Prior to time t3, a CAM device 500 can be continuing to activate a configurable number of CAM blocks (in this example ten) by way of dummy operations.

At time t3, a first search command can be received. A first search command (SRCH A) can direct searches to be performed on all or a portion of the user "visible" CAM blocks. In the particular example of FIG. 7, it is assumed that SEARCH A is directed to CAM blocks 1-8. As a result, in a following clock cycle, block searches can be executed on CAM blocks 1-8. However, at the same time, dummy searches can be executed on CAM blocks 9 and 10 in order to maintain the number of activated blocks at the configurable number (in this case 10).

At time t4, a second search command (SRCH B) is received. In the particular example of FIG. 7, it is assumed that SRCH B is directed to CAM blocks 1-10. As a result, in a following clock cycle, block searches can be executed on CAM blocks 1-10. No dummy searches are issued, as the number of CAM blocks searched is equal to the configurable number.

At time t5, a read command (READ) is received. In the particular example of FIG. 7, it is assumed that the READ command is directed to CAM block 8. To ensure, low dI/dt rates, control logic can issue dummy reads to CAM blocks 1-7 and 9-10 in order to continue to maintain the number of CAM blocks activated at the user configurable number.

In this way, after a CAM device is activating a user configurable number of CAM blocks, the CAM device can continue to activate the same number of CAM block even if a received command is directed to a smaller number of CAM blocks.

Figure 8:
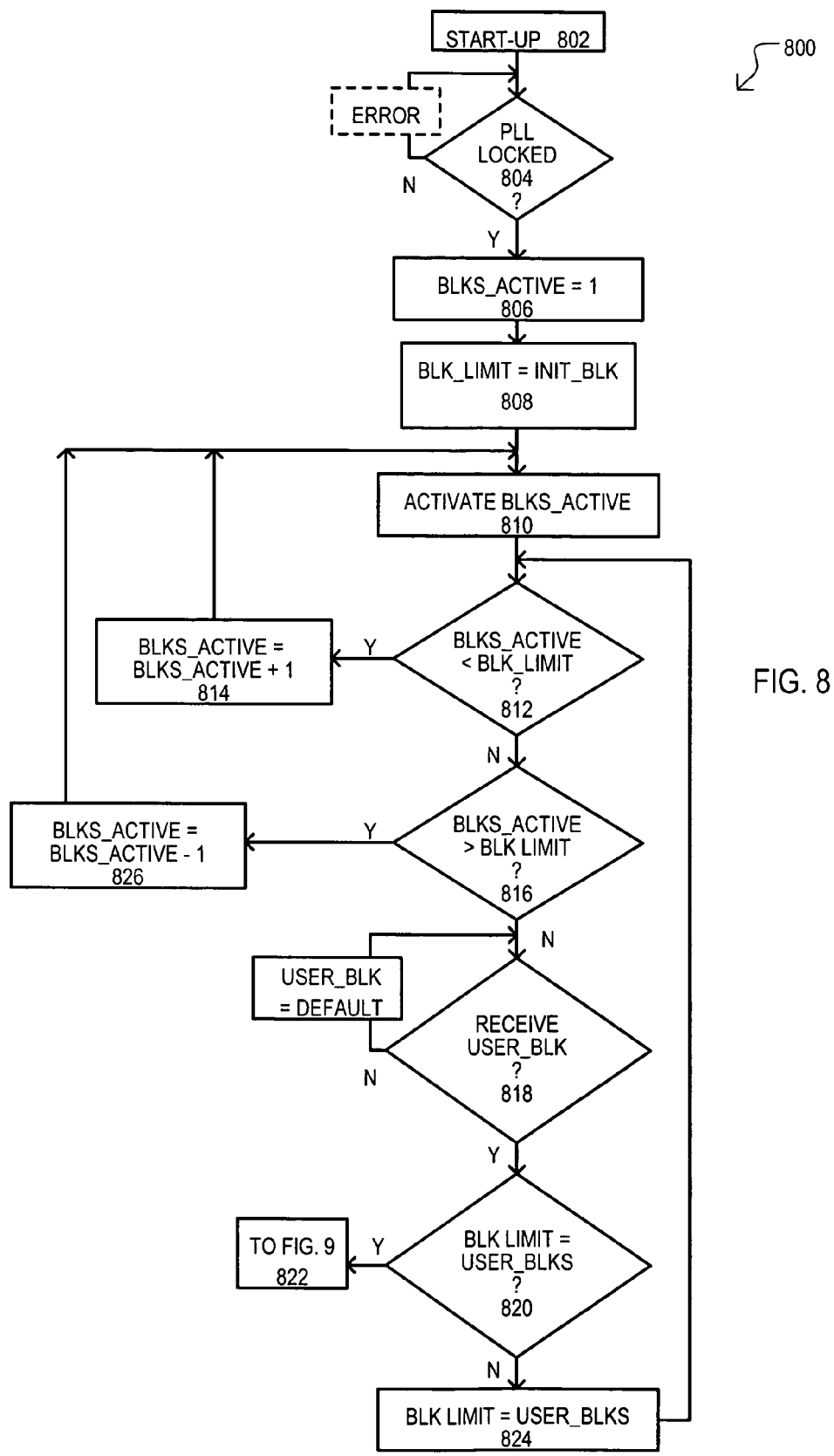
FIG. 8 is a flow diagram showing a method according to a fifth embodiment of the present invention.

Referring now to FIG. 8, a fifth embodiment of the present invention is set forth in a flow diagram and designated by the general reference character 800. The embodiment of FIG. 8 can be considered related to that of FIGS. 1-7 in that the previously disclosed CAM devices can operate according to the method of FIG. 8. Further, in one arrangement, the method of FIG. 8 can correspond to steps 202 to 210 of FIG. 2.

A method 800 can include a start-up (step 802), which can include a power being applied to a device, a reset operation, or some other predetermined event that could require re-initialization of a CAM device. A method 800 can then wait for PLL lock (step 804). Such step can include comparing other power-up states with a PLL lock indication. If PLL lock has not been achieved prior to another power-up condition, and error state can exist.

However, if a PLL achieves lock with an externally applied clock signal (Y branch from 804), a method 800 can continue by determining a set of CAM blocks to activate. In the particular example of FIG. 8, sequential activation is performed on one CAM block at a time, thus the set of CAM blocks to be activated (BLKS_ACTIVE) will initially include one CAM block (step 806). Such a feature may be "hardwired" into a CAM device. In addition, such a step can always select the same CAM block as a first CAM block to be activated, or may rotate through CAM blocks on start-up operations, to select a different first CAM block for each start-up event.

A method 800 may also determine an initial CAM block value that represents an initial set of CAM blocks (INIT_BLK) to be reached by sequential activation of CAM blocks (step 808). As in the case of step 806, the feature of step 808 may be "hardwired" in a CAM device. Preferably, an initial number of CAM blocks INIT_BLK can be one-half the total number of CAM blocks. Such an arrangement can allow an efficient starting point for reaching a subsequently determined user configurable number of CAM blocks. However, alternate embodiments can include a different number if it is know that a user determined value is more likely to be lower of higher than such a midpoint value.

A method 800 can then proceed to activate a sequentially larger number of CAM blocks (increase the set of activated CAM blocks) with dummy operations. In particular, a method can activate a designated number of CAM blocks (BLKS_ACTIVE) with dummy operations, which will initially be one (step 810). The number of blocks activated can then be compared to a present high limit value (step 812). This limit can be the initial value INIT_BLK (e.g., one-half the total number of CAM blocks). If such an initial number has not yet been reached (Y branch from 812), the number of CAM blocks in the activated set (BLKS_ACTIVE) can be increased. In the example shown, such a size can be incremented by one CAM block (step 814). A method can then return to step 810 to activate the larger number of blocks.

If the number of active blocks has reached a specified high limit (N branch from 812), the number of blocks activated can then be compared to a low limit value (step 816). In the arrangement shown, such a comparison step only has an effect after a user configurable number has been received. Accordingly, after activating the initial number of CAM blocks (INIT_BLK), a method 800 will follow the N branch from step 816 and proceed to step 818.

In a step 818, a method can receive a user configurable number of CAM blocks (USER_BLK). Such a step can include attempting to read from a predetermined register or otherwise accessing a location containing such a value. If such a value is not available, or considered invalid, a method 800 can use some default value as a user configurable number (e.g., the initial number INIT_BLK, for example).

A method 800 can then determine if a user number of blocks USER_BLK is equal to a current limit value BLK_LIMIT (step 820). If such values are equal (Y branch from 820), a method 800 can be complete, and, in the embodiment shown, can proceed to a method like that shown in FIG. 9. If however, such values are not equal (N branch from 820), a method 800 can proceed to adjust the number of CAM blocks in the activated set to the new limit. This can include setting a block limit value to the user configurable value (USER_BLK) (step 824), and then proceeding to step 812. The number of activated blocks can then be sequentially increased (steps 812 and 814) or sequentially decreased (steps 816 and 826) until the user configurable number is reached.

Figure 9:
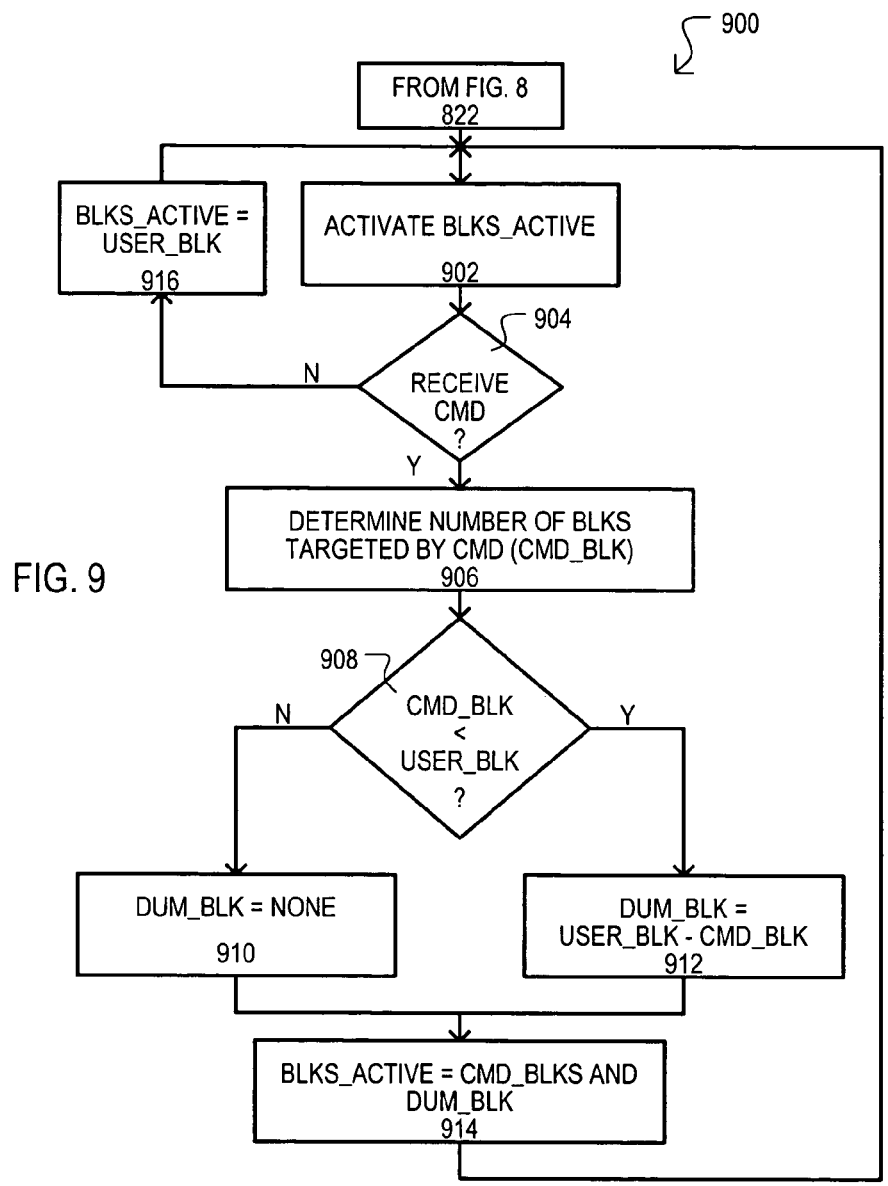
FIG. 9 is a flow diagram showing a method according to a sixth embodiment of the present invention.

Referring now to FIG. 9, a sixth embodiment of the present invention is set forth in a flow diagram and designated by the general reference character 900. The embodiment of FIG. 9 can be considered related to that of FIGS. 1-8 in that the previously disclosed CAM devices can operate according to the method of FIG. 9. Further, in one arrangement, the method of FIG. 9 can correspond to steps 212 to 214 of FIG. 2 and/or is a continuation of the method shown in FIG. 8.

A method 900 can include activating a set of indicated CAM blocks (step 902) BLKS_ACTIVE. In the particular example shown, it is assumed that number of activated blocks (BLKS_ACTIVE) is a user configurable number (USER_BLK). As shown, a method 900 can check to see if a command has been received (step 904). If no command has been received (N branch from 904), a CAM device can continue to perform dummy activation of CAM blocks (902).

If a command is received (Y branch from 904), a CAM device can determine the number of CAM blocks targeted by the command (step 906). Such a step can include decoding or otherwise determining targeted CAM blocks from received command data. A method 900 can then determine if the targeted number of blocks is less than the user configurable number of blocks (USER_BLK) (step 908). If the targeted number of blocks is not less than the user configurable number (N branch from 908), then no dummy operations are needed (step 910). However, if the targeted number of blocks is less than the user configurable number (Y branch from 908), then a set of dummy blocks (DUM_BLK) is selected from those CAM blocks not included in the set of targeted blocks CMD_BLK (step 912).

A method 900 may then activate the targeted CAM blocks (CMD_BLK) according to the received command, along with a set of additional CAM blocks (DUM_BLK) with dummy operations (step 914). Thus, a total number of activated blocks can be maintained at the user configurable number.

A method 900 may then return to a step 902 and operate according to another command or return to activating the user number of blocks with dummy operations (step 916).

Figure 10:
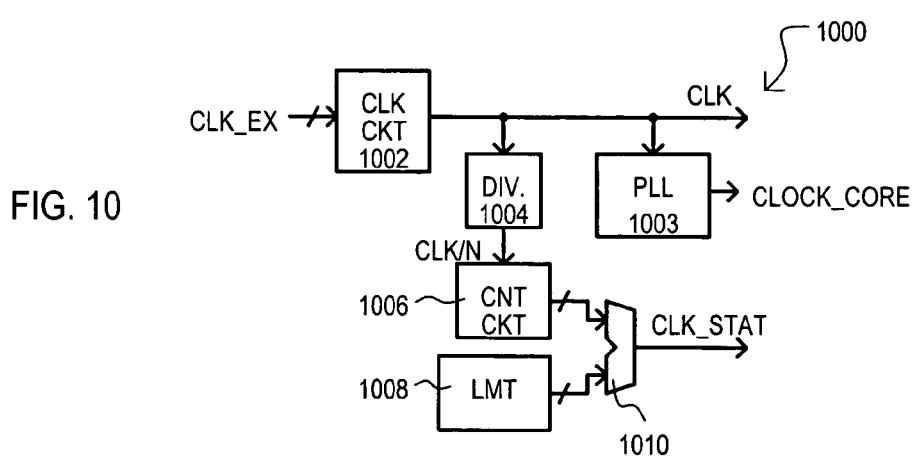
FIG. 10 is a block schematic diagram of a timing circuit according to one embodiment.

While the embodiment of FIG. 5 illustrates a start-up circuit that includes a PLL circuit for indicating when timing is sufficiently stable for dummy operations, the present invention should not be construed as being limited to any particular clock generating circuit. FIG. 10 shows one possible alternate embodiment. FIG. 10 is a block schematic diagram of a timing circuit 1000 that can generate a status indication that can be utilized to begin sequential dummy activation operations. The circuit of FIG. 10 could be included in start-up circuits of the various embodiments.

A timing circuit 1000 can include a clock circuit 1002, a PLL circuit 1003, a clock divider 1004, a counter circuit 1006, count value 1008, and a comparator 1010. In the particular example of FIG. 10, a clock circuit 1002 may generate an internal clock signal CLK based on an external clock signal CLK_EX. Thus, a clock circuit 1002 may include a clock buffer, as but one example. A clock signal CLK output by clock circuit 102 can be received by a PLL circuit 1003, which can generate an internal clock signal CLK_CORE for "core logic" sections of a device. Alternatively, while a clock circuit 1002 may preferably generate an internal clock signal CLK based on an external clock signal CLK_EX, in alternate arrangements, a clock circuit 1002 may be a clock source, such as an oscillator, and thus not receive an external clock signal.

An internal clock CLK generated by a clock circuit 1002 can be provided to clock divider 1004, which can generate divided clock signal CLK/N that can be input to counter circuit 1006. Counter circuit 1006 can generate a resetable count value based on divided clock signal CLK/N.

A count value CNT_CLK generated by counter circuit 1006 can be compared with a predetermined count limit LMT 1008 by comparator 1010. According to such a comparison, comparator 1010 can activate status indication CLK_STAT.

In this way, dummy activation of CAM blocks can be initiated by a relatively simple divide-by counter arrangement.

Various possible approaches to generating dummy operations will now be described. More detailed descriptions of such arrangements are shown in related U.S. patent application Ser. No. 11/014,123, now U.S. Pat. No. 7,149,101, of which this is a continuation-in-part.

Figure 11:
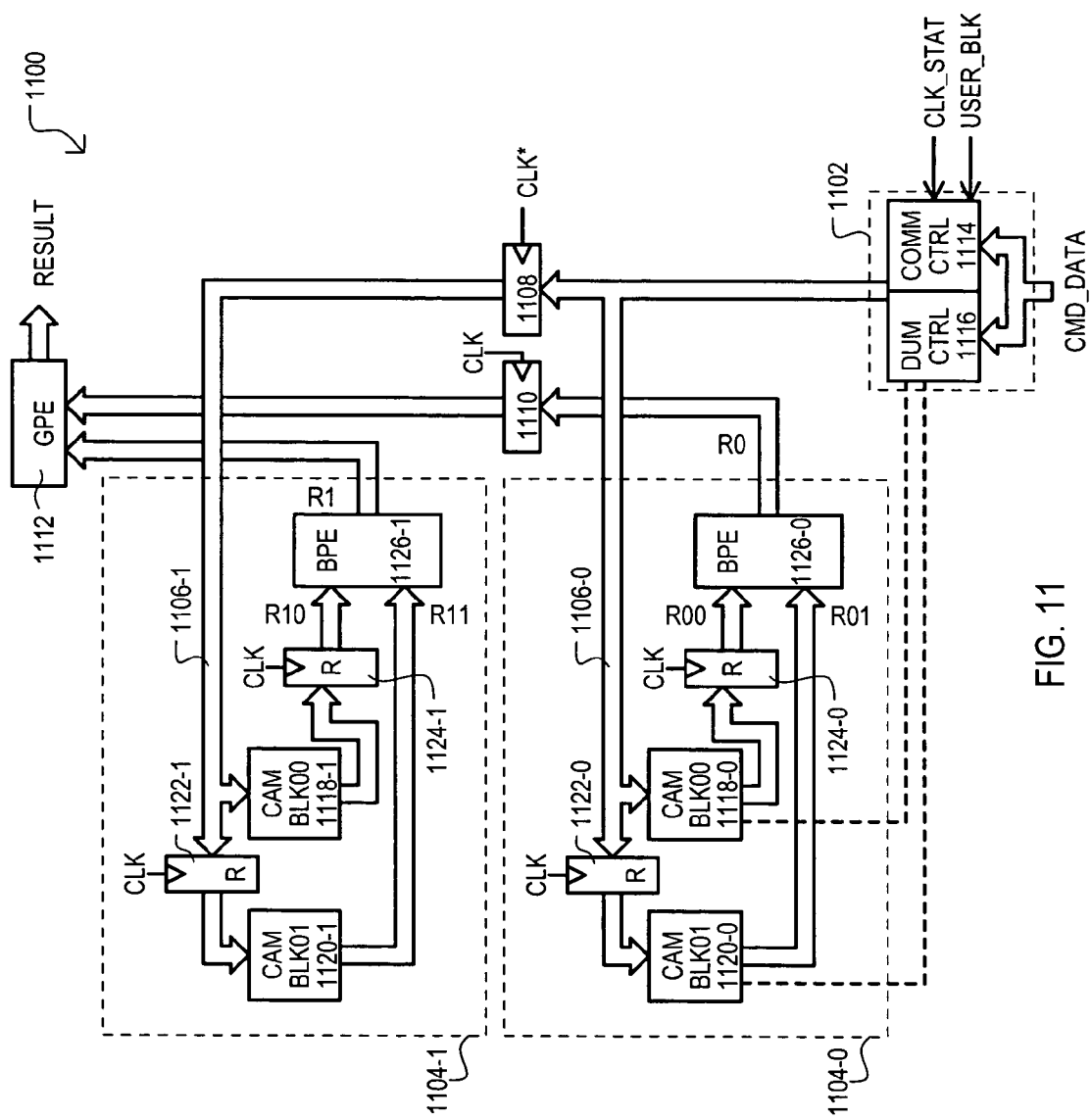
FIG. 11 is a block schematic diagram of a CAM device according to a seventh embodiment of the present invention.

Referring now to FIG. 11, a CAM device according to a second embodiment is set forth in a block schematic diagram and designated by the general reference character 1100. A CAM device 1100 can include a control block 1102, a first section 1104-0, a second section 1104-1, a first command data bus 1106-0, a second command data bus 1106-1, a section register 1108, and output register 1110, and a global priority encoder 1112.

In response to received command data, a status indication and/or user configurable block number, a control block 1102 can output operation control data, including search keys and the like, onto first command data bus 1106-0. A first section 1104-0 can receive such operation control data, and in response, generate result data that can be stored in output register 1110. Operational control data on first command bus 1106-0 can be stored in section register 1108, and then output onto second command data bus 1106-1 according to a clock signal CLK. Second section 1104-1 can receive such operation control data, and in response, generate result data that can be output to global priority encoder 1112. At the same essential time, result data for the same operation can be output from section register 1110 to global priority encoder 1112.

Global priority encoder 1112 can provide an "overall" result (RESULT) as an output.

A control block 1102 can include a command control circuit 1114 and a dummy control circuit 1116. A command control circuit 1114 can receive command data, such as search request and search keys, and in response thereto, issue command data on first command data bus 1106-0. A dummy control circuit 1116 can sense a valid search instruction ahead of time and/or start-up generated signals and initiate dummy operations in response thereto. Various examples of dummy control circuits will be described at a later point herein. For this reason, some lines output from dummy control section 1116 are shown in dashed form, as such lines may not be included in some embodiments.

In the particular example of FIG. 11, each section (1104-0 and 1104-1) has essentially the same structure, including a first CAM block 1118-0/1, a second CAM block 1120-0/1, a block register 1122-0/1, and an output register 1124-0/1. In a first section 1104-0, command data can be received by a first CAM block 1118-0 and stored in block register 1122-0. First CAM block 1118-0 can generate a result that is stored in output register 1124-0. In a subsequent clock cycle, command data in block register 1120-0 can be applied to second block 1120-0, which can generate a result (R01) supplied to block priority encoder (P.E.) 1126-0. On the same clock cycle, output register 1124-0 can output stored results (R00) to block P.E. 1126-0. Block P.E. 1126-0 can prioritize and encode such results, to provide a section result output (R0).

Second section 1104-1 operates in the same general fashion as first section 1104-0. However, second section 1104-1 can operate in response to command data issued from section register 1108. As a result, second section 11041 can operate with a one cycle delay with respect to first section 1104-0.

Having described a CAM device 1100 that can include a dummy control circuit, various examples of dummy control circuits will now be described with reference to FIGS. 12 to 14.

Figure 12:
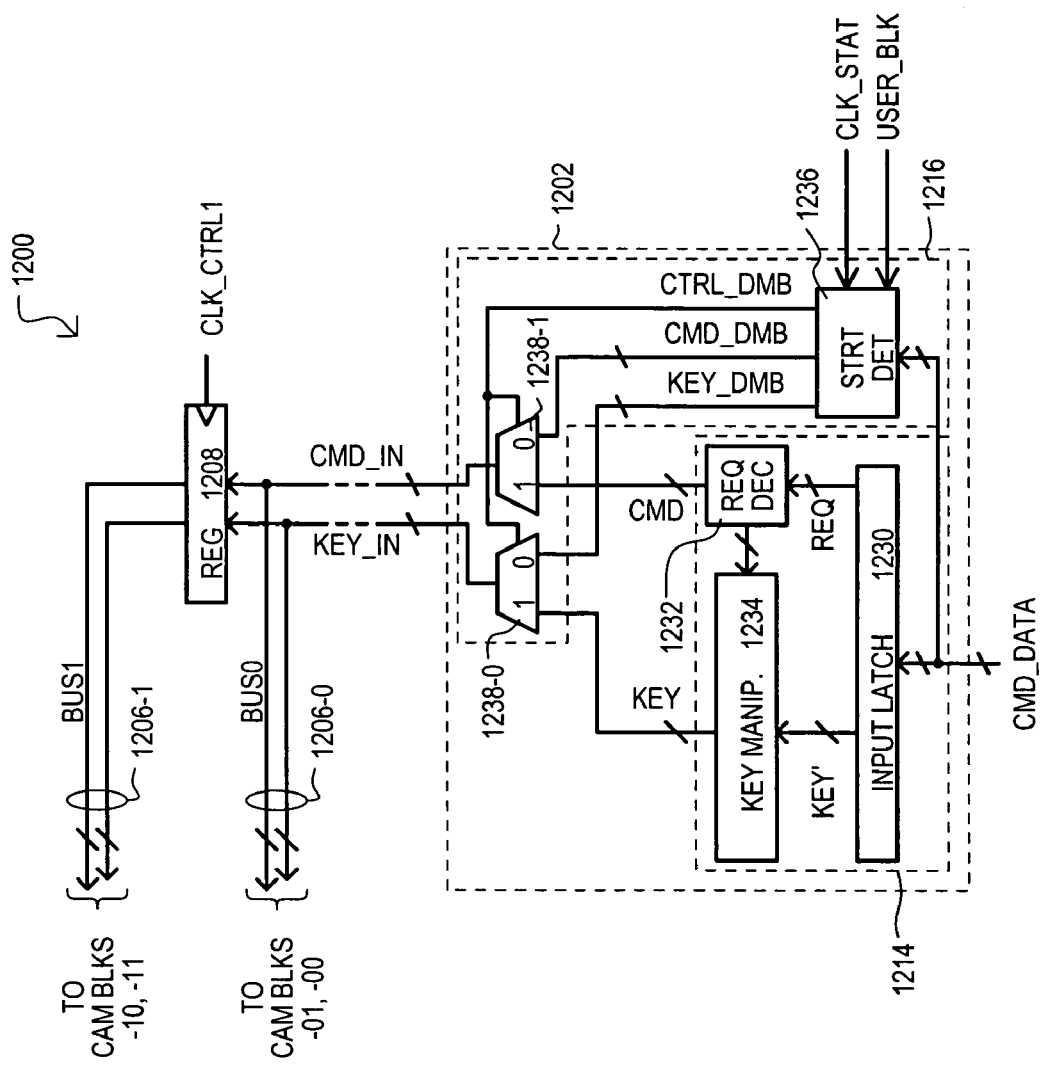
FIG. 12 is a block schematic diagram of a CAM device according to an eighth embodiment of the present invention.

A first dummy control circuit example is shown in FIG. 12. FIG. 12 is a block schematic diagram of a control block 1202 that includes a command control circuit 1214 and a dummy control circuit 1216. A command control circuit 1214 can include an input latch 1230 that can capture command data CMD_DATA. Such data can include a request portion REQ that specifies a particular operation to be performed in the CAM, as well as a "raw" key value KEY'. Request data REQ can be decoded in decoder 1232 to generate a command value CMD and control signals for a key manipulation circuit 1234. A key manipulation circuit 1234 can generate a search key value KEY from raw key value KEY'.

An input command and input data value (CMD_IN and KEY_IN) can be applied to one set of CAM blocks (00 and 01) by way of a first command data bus BUS0 1206-0, and to section register 1208. Section register 1208 can be controlled by a control clock signal CLK_CTRL1.

A dummy control circuit 1216 can include a start detect circuit 1236 and dummy multiplexers (MUXS) 1238-0 and 1238-1. A start detect circuit 1236 can essentially "look ahead" at an incoming request and/or receive a status indication CLK_STAT and user configurable value USER_

BLK, in order to generate a dummy search command (CMD_DMB) and a dummy key (KEY_DMB). In the case of FIG. 12, a start detect circuit 1236 can generate a MUX control signal CTRL_DMB having an active low level. In this way, in response to a valid search request or start-up status, dummy MUXs (1238-0 and 1238-1) can issue a dummy search command (CMD_DMB) and a dummy key (KEY_DMB).

Figure 13:
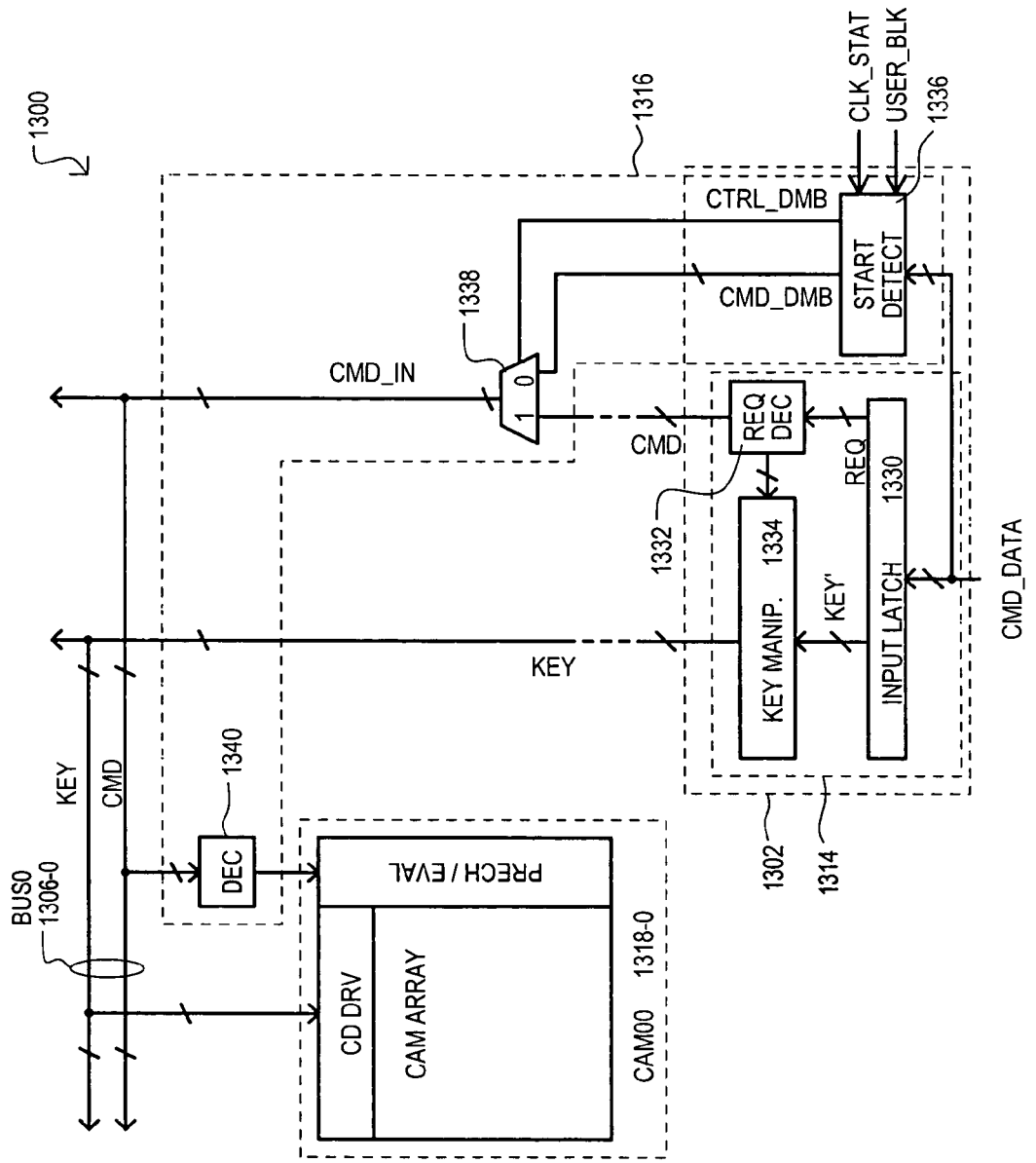
FIG. 13 is a block schematic diagram of a CAM device according to a ninth embodiment of the present invention.

A second dummy control circuit example is shown in FIG. 13. In this example, dummy searches are executed according to locally decoded commands. A dummy search command can be locally decoded in a block command decoder 1340. Thus, unlike the arrangement of FIG. 12, such dummy search commands can propagate to all CAM blocks, but are executed only by targeted CAM blocks in order arrive at a desired dummy activation sequence.

One particular example for selectively accessing CAM portions (e.g., segments, or blocks) is described in commonly-owned, co-pending U.S. patent application Ser. No. 10/264,667, titled CONTENT ADDRESSABLE MEMORY (CAM) DEVICE HAVING SELECTABLE ACCESS AND METHOD THEREFOR, by James et al., filed on Oct. 4, 2002. The contents of this application are incorporated by reference herein.

Figure 14:
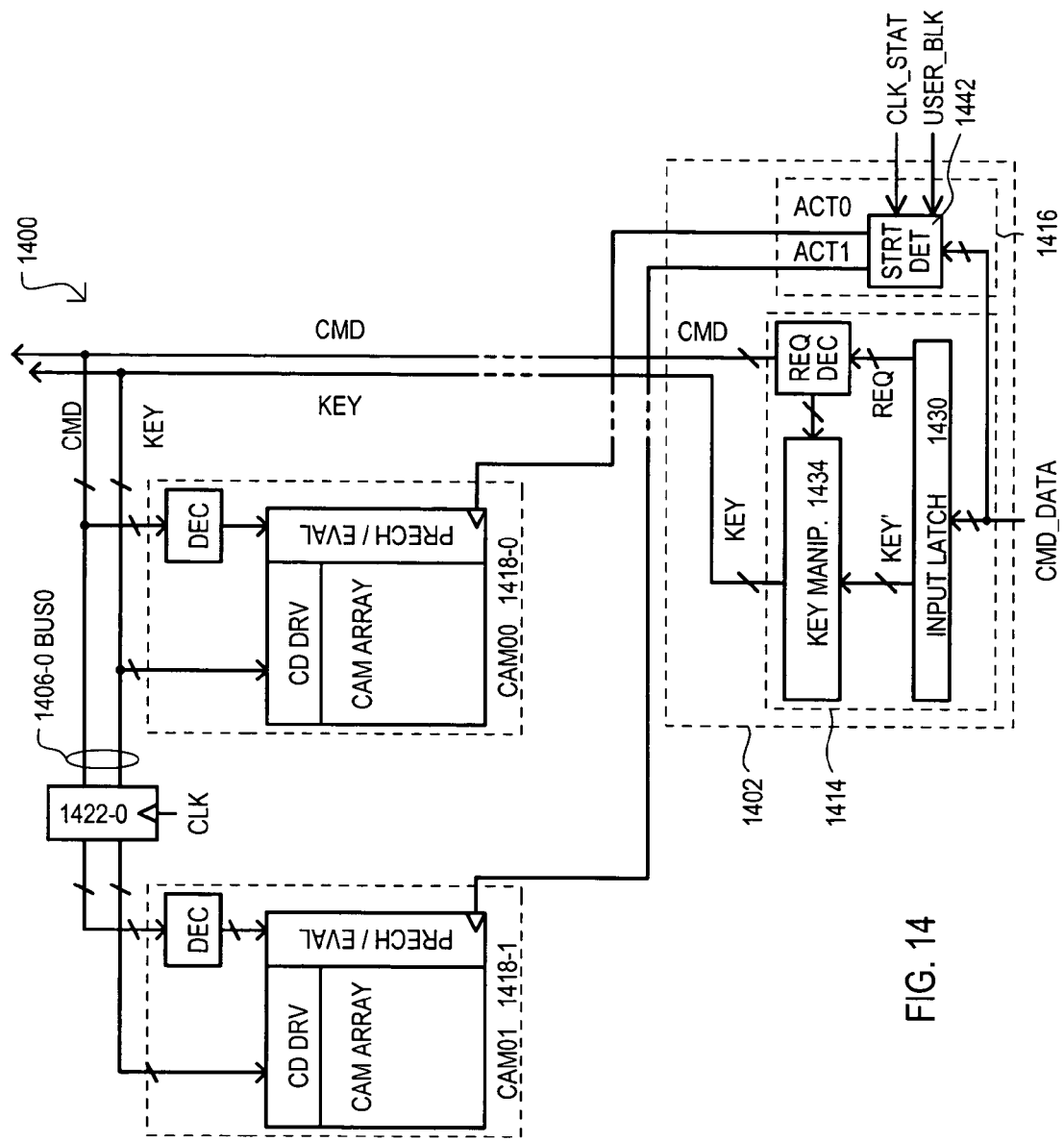
FIG. 14 is a block schematic diagram of a CAM device according to a tenth embodiment of the present invention.

A third dummy control circuit example is shown in FIG. 14. In this example, CAM blocks can be activated according to activation signals ACT0 and ACT1. Thus, in this arrangement, a request start detector 1442 can generate one or more activation signals prior to an actual search command and key being output from command control circuit 1414 or in response to a status indication and/or user configurable block number value. Thus, unlike the arrangement of FIGS. 12 and 13, such dummy search commands can be initiated independent of a command data bus. Of course, the arrangement of FIG. 14 could utilize a single activation signal ACT0, which can be applied to second CAM block 520-1 by a clocked register, or the like.

Of course all of the above dummy control circuits are but examples, and should not necessarily be construed as limiting the invention thereto.

Another embodiment of a CAM device will now be described with reference to FIG. 15. A CAM device 1500 can have many of the same circuit sections as the embodiment shown in FIG. 11. The CAM device 1500 can differ from that of FIG. 11 in that it can "split" command and data buses 1544-0 and 1544-1 that apply different portions of one search key to different CAM blocks.

Figure 15:
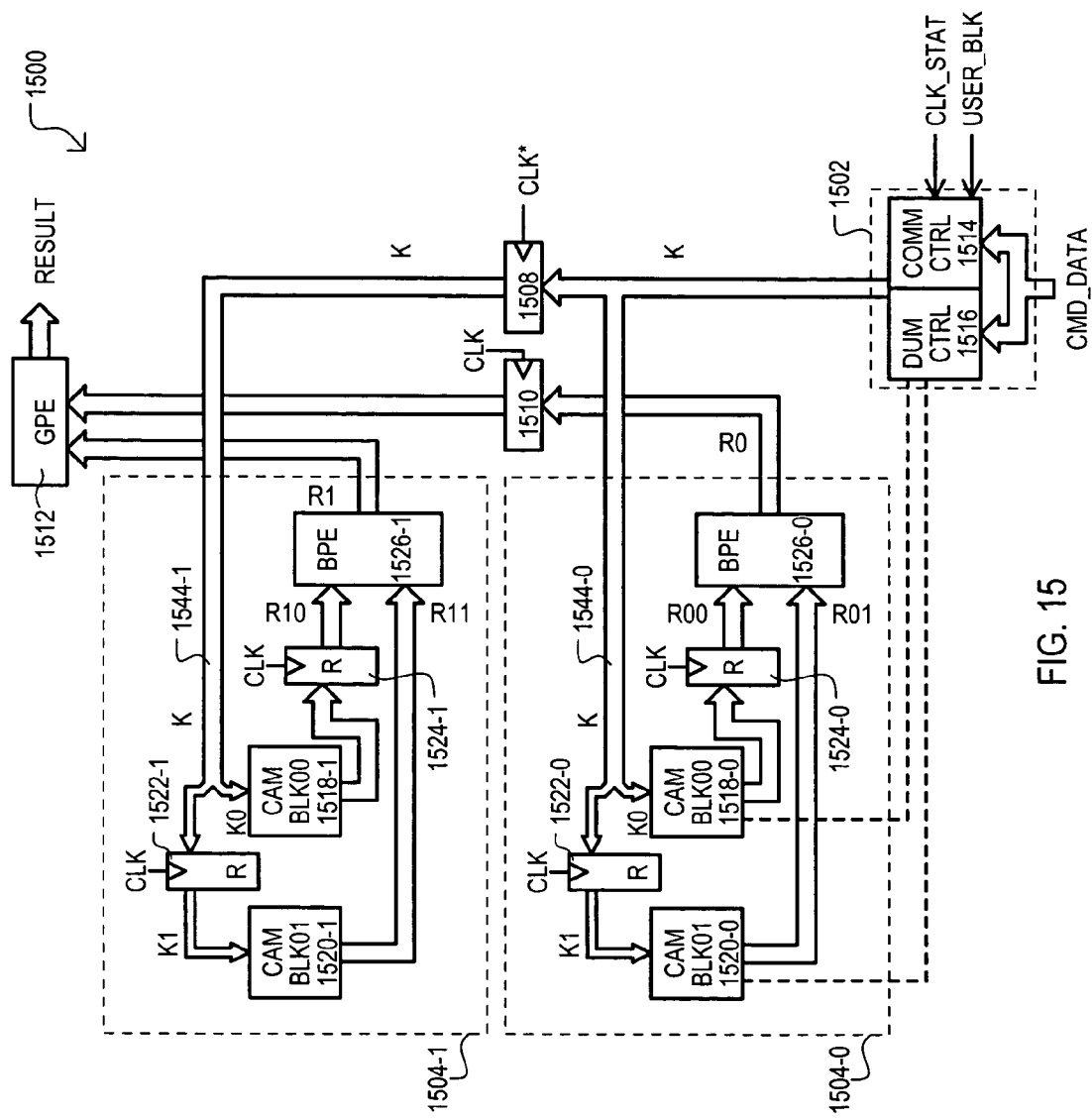
FIG. 15 is a block schematic diagram of a CAM device according to an eleventh embodiment of the present invention.

More particularly, as shown in FIG. 15, in a search operation, a search key (K) may be issued from control block 1502. However, only a first portion (K0) of search key (K) can be applied to first CAM blocks 1518-0/1, while only a second portion (K1) of the same search key (K) can be applied to second CAM blocks 1520-0/1.

In this way, current transients may be further reduced by spreading activation for one search key over a longer period of time.

Figure 16:
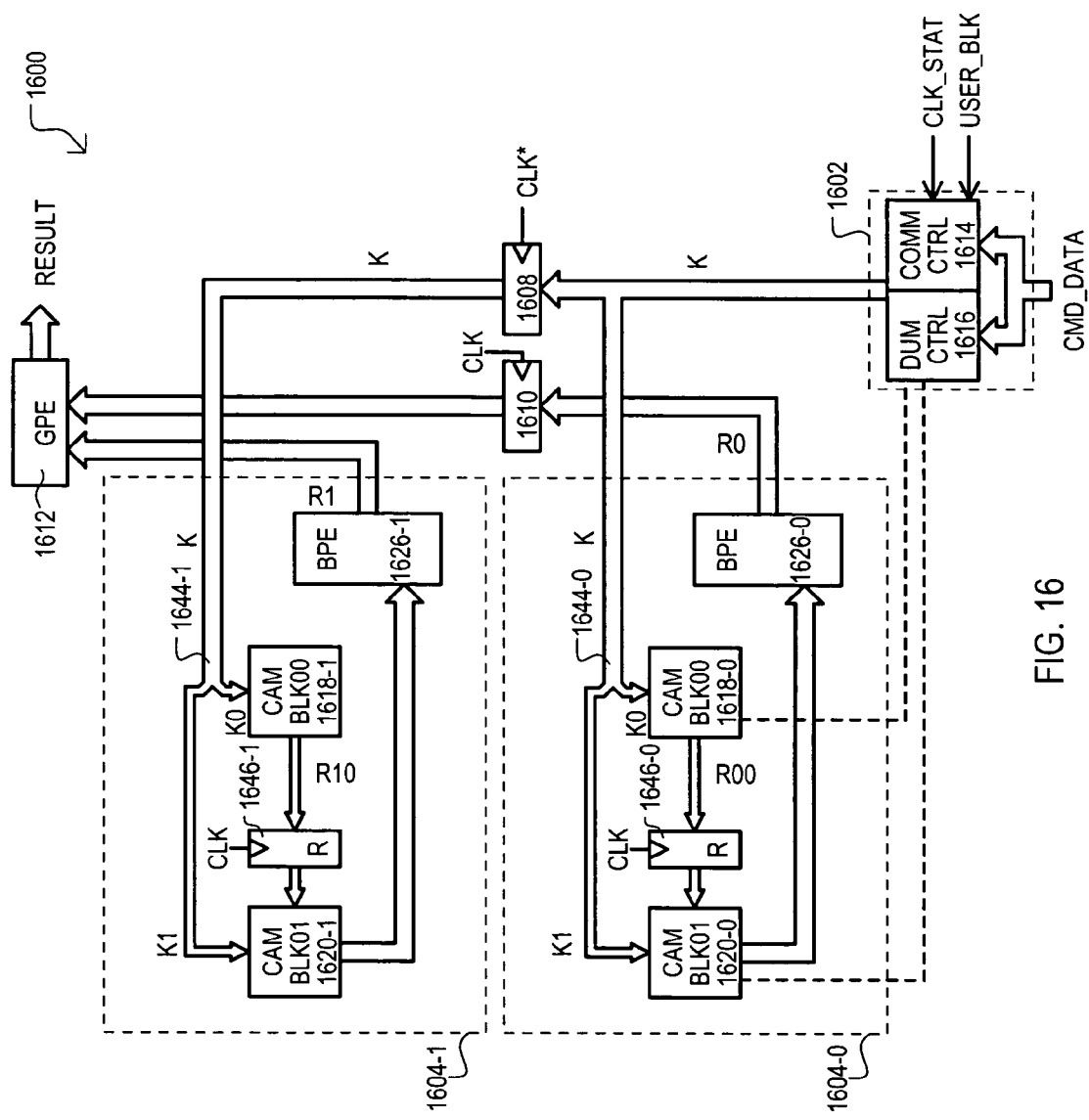
FIG. 16 is a block schematic diagram of a CAM device according to a twelfth embodiment of the present invention.
Figure 17A:
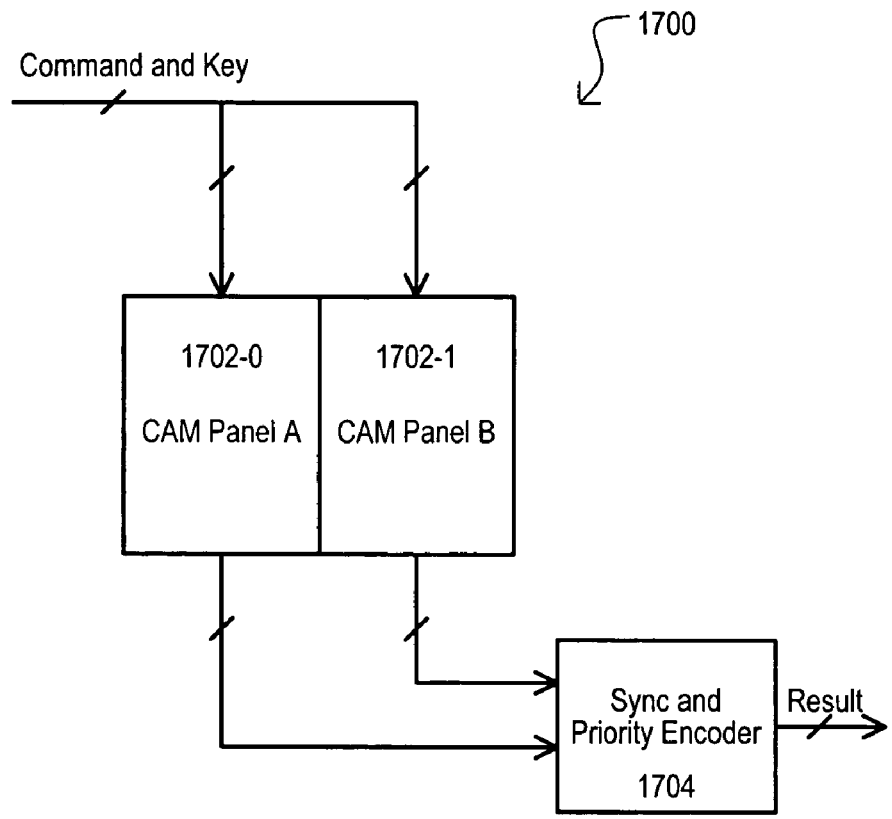
FIG. 17A is a block diagram showing a conventional CAM device.
Figure 17B:
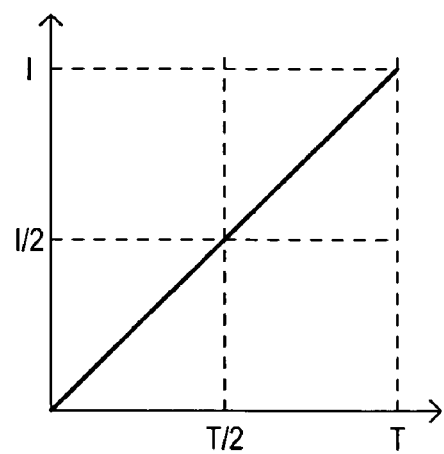
FIG. 17B is a graph illustrating current consumption of the conventional CAM device of FIG. 17A.

Yet another embodiment of a CAM device will now be described with reference to FIG. 16. A CAM device 1600 can have many of the same circuit sections as the embodiment shown in FIG. 15. The CAM device 1600 can differ from that of FIG. 15 in that first CAM blocks 1618-0/1 can be separated from corresponding second CAM blocks 1620-0/1 by conditional enable register circuits 1646-0/1. A conditional enable register circuit 1646-0/1 can condition the activation of one CAM block entry upon results of the other. Thus, in the arrangement of FIG. 16, partial compare results (results from key portion K0) generated in a first CAM block (e.g., 1618-0) can inhibit the search of selected entries with key portion K1 in the second CAM block (e.g., 1620-0).

Very particular examples of such conditional activation of CAM blocks are shown in U.S. application Ser. No. 10/746,899, titled STAGGERED COMPARE ARCHITECTURE FOR CONTENT ADDRESSABLE MEMORY by Om et al., filed on Dec. 24, 2003, now U.S. Pat. No. 6,958,925. The contents of this application are incorporated by reference herein.

In this way even greater reductions in current savings can be achieved, as conditionally searched second CAM blocks 1620-0/1 will, in most applications, draw considerably less current than a CAM block that searches all entries.

The above embodiments have shown various approaches that can limit current transients by activating CAM blocks to perform dummy operations in order to achieve a gradual sequential activation for all CAM blocks upon the start up of a CAM device. Further, such a sequential activation of CAM blocks may take advantage of an interim period in which timing within the CAM device may be settled but other portions of the device have not yet completed a power-up sequence of steps.

In addition, while the embodiments have described sequential operations according to a clock signal, other embodiments can include self-timed arrangements in which a clock can be generated from an output value from one CAM block applied to another CAM block.

Along these same lines, while a sequential activation of increasingly larger numbers of CAM blocks can include increasing by a count of one, alternate embodiments can include sequentially activating more than one CAM block.

The various embodiments of the present invention can enjoy wide application in various industries. As but one example, CAM devices and power saving methods of the present invention can be utilized in packet processing devices, such as routers and switches, as look up tables for packet forwarding, classification, and the like. In such an application power supply transients can be reduced without loss of compare result throughput.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method of activating separate blocks of a content addressable memory (CAM) device, comprising the steps of:

sequentially activating an increasingly larger number of CAM blocks until an initial number of CAM blocks is activated, the initial number of CAM blocks being greater than two; and if the initial number of CAM blocks is not equal to a configurable block number, sequentially changing the number of activated CAM blocks until the number of active CAM blocks is equal to the configurable block number value.

2. The method of claim 1, further including:

CAM block operations are based on a CAM timing signal; and prior to sequentially activating an increasingly larger number of CAM blocks, determining that the CAM timing signal is stable.

3. The method of claim 2, wherein:
the step of determining that the CAM timing signal is stable includes determining that a phase locked loop (PLL) circuit is locked with a received clock signal.

4. The method of claim 2, wherein:
the step of determining that the CAM timing signal is stable includes determining that a received clock signal has executed a predetermined number of cycles.

5. The method of claim 1, wherein:
the step of sequentially activating an increasingly larger number of CAM blocks includes activating one CAM block each cycle of a clock signal until the initial number of CAM blocks is activated.

6. The method of claim 1, further including:
receiving a command targeted to activate a command number of CAM blocks; and
if the command number of CAM blocks is less than the configurable block number, activating an additional number CAM blocks not targeted by the command until the total number of CAM blocks activated in response to the command is equal to the configurable block number value.

7. A content addressable memory (CAM) device, comprising:
a plurality of CAM blocks, each comprising a plurality of CAM entries that compare a key value essentially simultaneously to data values stored in the CAM entries; and
a control circuit that receives a first control signal and a configurable block number value, the control circuit sequentially activating an increasingly larger number of CAM blocks in response to a first control signal until an initial number of CAM blocks is activated, and if the initial number of CAM blocks is not equal to the configurable block number value, sequentially changing the number of activated CAM blocks until the number of CAM blocks is equal to the configurable block number value, the configurable block number value being greater than two.

8. The CAM device of claim 7, further including:
a register coupled to the control circuit that stores the configurable block number value.

9. The CAM device of claim 7, further including:
a timing circuit that activates the first control signal in response to a received clock signal.

10. The CAM device of claim 9, wherein:
the timing circuit comprises a phase locked loop (PLL) circuit that activates the first control signal when the PLL circuit is locked with the received clock signal.

11. The CAM device of claim 9, wherein:
the timing circuit comprises
a divider circuit coupled to a received clock signal,
a counter having an input coupled to the output of the divider circuit and an output that provides a count value, and
a comparator that compares the count value to a predetermined value and activates the first control signal based on the comparison result.

12. The CAM device of claim 7, wherein:
the control circuit sequentially activates one CAM block each cycle of a CAM clock signal until the initial number of CAM blocks is activated.

13. The CAM device of claim 7, wherein:
the control circuit sequentially changes number of activated CAM blocks by one each cycle of a CAM clock signal until the number of CAM blocks is equal to the configurable block number value.

14. The CAM device of claim 7, wherein:
if the configurable block number value is less than the initial number of CAM blocks, the control circuit sequentially decreases the number of active CAM blocks until the number of CAM blocks is equal to the configurable block number value.

15. The CAM device of claim 7, wherein:
if the configurable block number value is greater than the initial number of CAM blocks, the control circuit sequentially increases the number of active CAM blocks until the number of CAM blocks is equal to the configurable block number value.

16. The CAM device claim 7, further including:
a command decoder that decodes a received command targeted to activate a command number of CAM blocks; and
if the command number of CAM blocks is less than the configurable block number value, the control circuit activates an additional number CAM blocks not targeted by the decoded command until the total number of activated CAM blocks is equal to the configurable block number value.

17. A method of reducing current consumption rate changes in a content addressable memory (CAM), comprising the steps of:
issuing dummy search operations to increasingly larger numbers of CAM blocks within the CAM device until an initial number of CAM blocks is activated, the initial number of CAM blocks being less than the total number of CAM blocks in the CAM device;
receiving a configurable block number; and
incrementally changing the number of issued dummy searches, if the configurable block number is different from the initial number of CAM blocks, until the number of activated CAM blocks is equal to the configurable block number.

18. The method of claim 17, wherein:
the step of issuing dummy search operations to increasingly larger numbers of CAM blocks includes increasing the number of dummy searches to the CAM blocks by one in successive time periods; and
the step of incrementally changing the number of issued dummy searches includes
if the initial number of CAM blocks is greater than the configurable block number, decreasing the number of dummy searches by one in successive time periods until the number of activated CAM blocks is equal to the configurable block number, and
if the initial number of CAM blocks is less than the configurable CAM block number, increasing the number of dummy searches by one in successive time periods until the number of activated CAM blocks is equal to the configurable block number.

19. The method of claim 17, further including:
receiving a command targeted to activate a command number of CAM blocks; and
issuing dummy searches to CAM blocks not targeted by the command if the number of CAM blocks targeted by the command is less than the configurable block number to bring the total number of CAM blocks activated in response to the command to the configurable block number.

20. The method of claim 19, wherein:
the command includes a read operation that accesses data stored in at least one CAM block while other CAM blocks are performing dummy search operations.

* * * * *